(12) United States Patent
Haba et al.

(10) Patent No.: US 8,916,781 B2
(45) Date of Patent: Dec. 23, 2014

(54) CAVITIES CONTAINING MULTI-WIRING STRUCTURES AND DEVICES

(75) Inventors: Belgacem Haba, Saratoga, CA (US); Ilyas Mohammed, Santa Clara, CA (US); Craig Mitchell, San Jose, CA (US); Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 233 days.

(21) Appl. No.: 13/296,785

(22) Filed: Nov. 15, 2011

(65) Prior Publication Data

US 2013/0122747 A1    May 16, 2013

(51) Int. Cl.
| | | |
|---|---|---|
| H05K 1/11 | (2006.01) | |
| H05K 1/03 | (2006.01) | |
| H05K 1/09 | (2006.01) | |
| H05K 1/00 | (2006.01) | |
| H01L 23/498 | (2006.01) | |
| H01R 12/71 | (2011.01) | |
| H05K 3/42 | (2006.01) | |

(52) U.S. Cl.
CPC .... H01R 12/714 (2013.01); *H05K 2201/10378* (2013.01); H01L 23/49827 (2013.01); *H05K 2203/0242* (2013.01); *H05K 2201/09645* (2013.01); *H05K 2203/025* (2013.01); H05K 1/115 (2013.01); *H05K 1/114* (2013.01); *H01L 2924/0002* (2013.01); H05K 3/42 (2013.01)
USPC .......... 174/262; 174/255; 174/256; 174/257; 174/258; 174/265

(58) Field of Classification Search
CPC .......... H05K 1/112; H05K 2201/096
USPC .......... 361/42, 760; 174/262–266, 255–258; 439/74, 75, 78
See application file for complete search history.

(56) References Cited

U.S. PATENT DOCUMENTS

| | | | | |
|---|---|---|---|---|
| 3,702,284 | A * | 11/1972 | Merkenschlager | 205/126 |
| 4,636,919 | A * | 1/1987 | Itakura et al. | 361/794 |
| 5,133,669 | A * | 7/1992 | Barnhouse et al. | 439/78 |
| 5,340,947 | A * | 8/1994 | Credle et al. | 174/262 |
| 5,528,000 | A * | 6/1996 | Allardyce et al. | 174/266 |
| 5,541,567 | A * | 7/1996 | Fogel et al. | 336/200 |
| 6,479,764 | B1 * | 11/2002 | Frana et al. | 174/262 |
| 6,753,480 | B2 * | 6/2004 | Maa et al. | 174/255 |
| 6,927,346 | B2 * | 8/2005 | McCormick et al. | 174/260 |
| 7,282,784 | B2 * | 10/2007 | Kirby et al. | 257/621 |
| 7,535,093 | B1 * | 5/2009 | Ables et al. | 257/698 |
| 2002/0166688 | A1 * | 11/2002 | Smith | 174/52.2 |
| 2007/0258173 | A1 * | 11/2007 | Chen et al. | 361/42 |
| 2008/0078572 | A1 * | 4/2008 | Watanabe et al. | 174/262 |
| 2010/0163296 | A1 * | 7/2010 | Ko et al. | 174/262 |
| 2010/0236823 | A1 * | 9/2010 | Hu et al. | 174/262 |
| 2012/0313239 | A1 | 12/2012 | Zohni | |

* cited by examiner

*Primary Examiner* — Timothy Thompson
*Assistant Examiner* — Sherman Ng
(74) *Attorney, Agent, or Firm* — Lerner, David, Littenberg, Krumholz & Mentlik, LLP

(57) ABSTRACT

An interconnection component includes an element with an opening, a plurality of conductors electrically insulted from one another extending through the opening, and a plurality of second contacts electrically insulated from one another. The element is comprised of a material having a coefficient of thermal expansion of less than 10 parts per million per degree Celsius. At least some of the conductors extend along at least one inner surface of the opening. The conductors define a plurality of wettable first contacts at the first surface. The first contacts are at least partially aligned with the opening in a direction of the thickness and electrically insulated from one another.

36 Claims, 42 Drawing Sheets

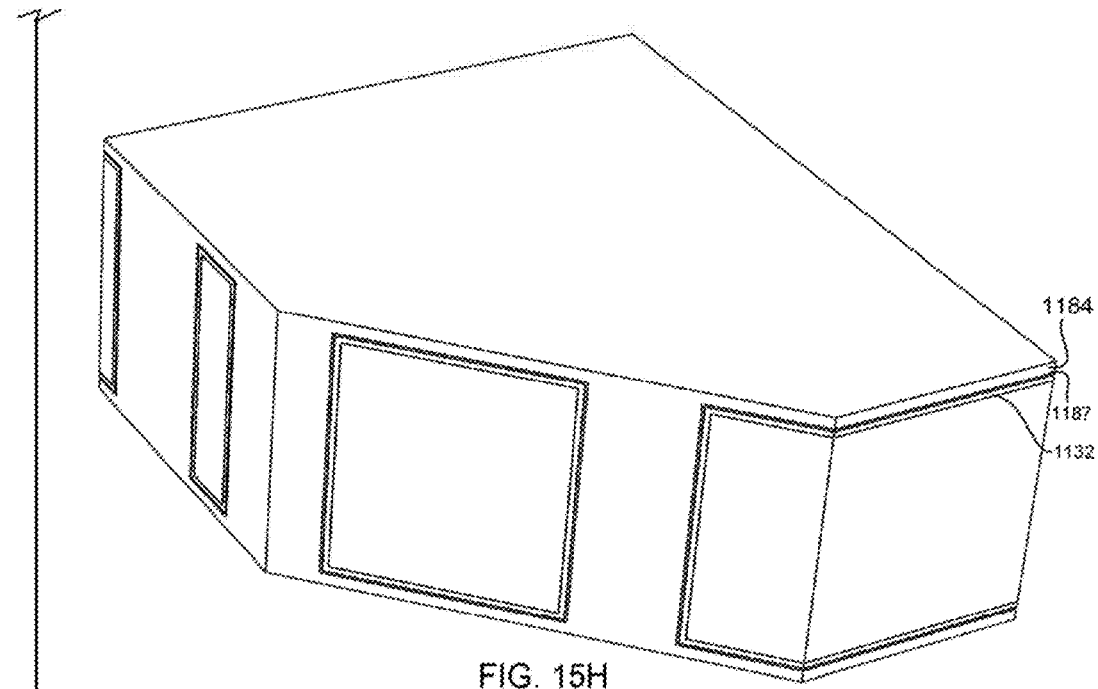
FIG. 15H
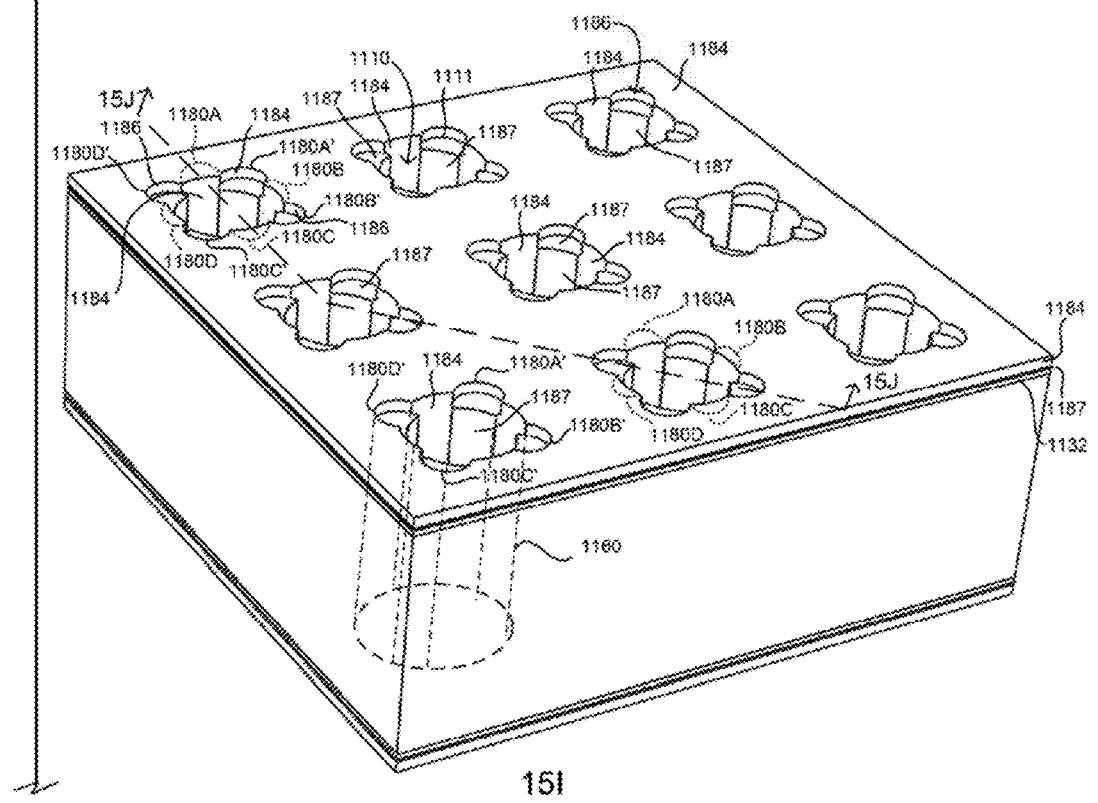
15I

CAVITIES CONTAINING MULTI-WIRING STRUCTURES AND DEVICES

BACKGROUND OF THE INVENTION

Microelectronic devices such as semiconductor chips typically require many electrical connections to other electronic components for input and output of signals, power and ground. The electrical contacts provided on a semiconductor chip or other comparable device for this purpose are generally disposed in grid-like patterns that substantially cover a surface of the device (commonly referred to as an "area array") or in elongated rows which may extend parallel to and adjacent each edge of the device's front surface, or in the center of the front surface.

Devices such as chips can be physically mounted on a substrate having electrically conductive elements thereon such as electrically conductive vias and traces, with the contacts of the device electrically connected to electrically conductive elements of the substrate. Some such substrates include openings or vias that extend through opposed surfaces of the substrate to provide an electrical interconnection between the chip at or overlying one surface and another chip or electrical device at or overlying the opposed surface. In some such structures, thermal expansion between the material comprising the via and the surrounding material of the substrate itself can lead to a high degree of stress in the substrate.

Although there have been numerous methods and structures advanced to minimize the stress in the substrate, there is a need for improved designs.

BRIEF SUMMARY OF THE INVENTION

In one aspect of the present invention, an interconnection component includes an element with an opening extending between the first and second surfaces of the element and a plurality of conductors extending through the opening. The element may have first and second opposed surfaces defining a thickness of less than 1000 microns. The element may consist essentially of a material having a coefficient of thermal expansion ("CTE") of less than 10 parts per million per degree Celsius. The plurality of conductors that extend through the opening are electrically insulated from one another. At least some of the conductors extend along at least one inner surface of the opening. The conductors may define a plurality of wettable first contacts at the first surface. The first contacts may be at least partially aligned with the opening such that the aligned portions of the contacts may be disposed within a projection of the interior area of the opening in a vertical direction orthogonal to the first surface of the substrate and electrically insulated from one another. The plurality of second contacts are exposed at the second surface and may be electrically insulated from one another.

In an alternative embodiment, the interconnection component includes masses of bond material attached to the first contacts. In one embodiment, the masses of bond material include a bond metal.

In another alternative embodiment, at least some of the first contacts partially overlie the first surface.

In another embodiment, masses of bond metal are attached to the second contacts.

In still another embodiment, the second contacts are aligned at least partially with the opening in a direction of the thickness and the second contacts are defined by the plurality of conductors.

In another embodiment, at least some of the second contacts partially overlie the second surface. The second contacts may be aligned at least partially with the opening in a direction of the thickness and the second contacts may be defined by the plurality of conductors.

In another embodiment, portions of the conductors that define the first contacts include a first metal layer and a first wettable layer. The first wettable layer may include at least one of an organic solderability preservative ("OSP"), a metal or a conductive compound of a metal. The first wettable layer may be a metal clad layer and the conductors may have surfaces extending into the opening which are uncovered by the first wettable layer. Second contacts may also be defined by the plurality of conductors and may be at least partially aligned with the opening in a direction of the thickness. The second contacts may include a second metal layer and a second wettable layer that include at least one of an OSP, a metal or a conductive compound of a metal. The conductors may have surfaces extending into the opening which are uncovered by the wettable layer.

In another embodiment, a void may be within the opening. The void may be open to the plurality of conductors.

In another embodiment, a dielectric region may be disposed within the opening and the plurality of conductors may be insulated from one another by the dielectric region. The dielectric region may have a dielectric constant K of less than 2.0.

In an alternative embodiment, the plurality of conductors define first and second pairs of coaxial conductors extending at least partially within the opening.

In still another embodiment, a dielectric region insulates the plurality of conductors from one another within the opening and the dielectric region has voids.

In another embodiment, at least some of the first contacts are posts projecting to a height of at least 30 microns above the first surface.

In another embodiment, the opening includes a central opening and a plurality of peripheral openings that are each open to the central opening. Each of the central and peripheral openings extend through the thickness and at least some of the conductors extend along inner surfaces of the peripheral openings.

In another aspect of the present invention, an interconnection component includes an element that has an opening, a dielectric layer disposed within the opening, a plurality of conductors extending through the dielectric layer within the opening, masses of bond material attached to the first contacts, and a plurality of second contacts. The element has first and second opposed surfaces defining a thickness of less than 500 microns, the element having an opening extending between the first and second surfaces, the element consisting essentially of a first material having a CTE of less than 10 parts per million per degree Celsius. A dielectric layer other than the first material may be disposed within the opening. A plurality of conductors may extend through the dielectric layer within the opening and the conductors may define a plurality of wettable first contacts at the first surface. The first contacts may be aligned at least partially with the opening in a direction of the thickness and may be electrically insulated from one another. At least first and second ones of the conductors may be configured to simultaneously carry first and second different electric potentials. Masses of bond material may be attached to the first contacts and a plurality of second contacts may be exposed at the second surface and electrically insulated from one another.

In an embodiment of this aspect of the invention, the dielectric layer may have a Young's modulus lower than a Young's modulus of the plurality of conductors and lower than a Young's modulus of the element.

In another embodiment, the plurality of conductors define first and second pairs of coaxial conductors extending at least partially within the opening. Alternatively, the plurality of conductors may also further include at least one non coaxial conductor extending at least partially within the opening. Alternatively, a dielectric region may insulate the plurality of conductors from one another within the opening, the dielectric region having voids.

In another alternative embodiment, at least some of the first contacts are posts projecting to a height of at least 30 microns above the first surface. Alternatively, second contacts are at least partially aligned with the opening in a direction of the thickness; the second contacts may be defined by the plurality of conductors; and at least some of the second contacts are posts projecting to a height of at least 30 microns above the second surface. Alternatively, there is also a microelectronic element having contacts on a contact bearing face thereof facing the first surface and the contacts are joined to corresponding ones of the first contacts through masses of bond material. Alternatively, there may also be first and second microelectronic elements that each have contacts on a contact bearing face thereof facing the first surface. The contacts of each of the first and second microelectronic elements may be joined to corresponding ones of the first contacts through masses of bond material. The first and second microelectronic elements may be active chips or passive components and may be joined through the interconnection component to third and fourth components.

In another alternative embodiment, the opening includes a central opening and a plurality of peripheral openings each being open to the central opening, each of the central and peripheral openings extending through the thickness, wherein at least some of the conductors extend along inner surfaces of the peripheral openings. Alternatively, each of the at least some conductors extends within a different one of the peripheral openings.

In accordance with another aspect of the present invention, a method for making an interconnection component comprises forming a mask layer; forming a plurality of mask openings in the mask layer; and forming electrical conductors. The mask layer may be covering a first opening in a sheet like element having first and second opposed surfaces. The element may consist of a material having a CTE of less than 10 parts per million per degree Celsius. The first opening and a portion of the first surface may be partly aligned with each mask opening. Electrical conductors may be formed on spaced apart portions of the first surface and on spaced apart portions of an interior surface within the first opening which are exposed by the mask openings. Each conductor may extend along an axial direction of the first opening. The first conductors may be fully separated from one another within the first opening.

In accordance with another aspect of the present invention, a method for making an interconnection component comprises forming a mask layer; forming a first mask opening in at least a portion of the mask layer overlying the first opening to expose portions of the seed layer within the peripheral openings; and forming electrical conductors on exposed portions of a conductive seed layer. The mask layer may cover a first opening in a sheet-like element that has first and second opposed surfaces. The first opening may extend between the first and second surfaces. The element may consist of a material having a CTE of less than 10 parts per million per degree Celsius. The first opening may include a central opening and a plurality of peripheral openings open to the central opening and extending in an axial direction of the central opening. The seed layer may cover an interior surface of the opening and may also be disposed between the mask layer and the first and second opposed surfaces of the sheet-like element. Electrical conductors may be formed on exposed portions of the seed layer. The conductors may extend within the peripheral openings and onto the first surface.

In another aspect of the present invention, a method for making an interconnection component comprises forming a mask layer; forming a first mask opening in the mask layer to expose at least portions of interior surfaces of the peripheral openings; and forming electrical conductors on the exposed portions of the interior surfaces of the peripheral openings. The mask layer may cover a first opening in a sheet-like element having first and second opposed surfaces. The first opening may extend between the first and second surfaces and the element may consist of a material having a CTE of less than 10 parts per million per degree Celsius. The first opening may include a central opening and a plurality of peripheral openings open to the central opening and extending in an axial direction of the central opening. The first mask opening in the mask layer may expose at least portions of interior surfaces of the peripheral openings and other portions of the first opening may remain covered by the mask layer. Electrical conductors may be formed on the exposed portions of the interior surfaces of the peripheral openings and extend onto the first surface.

In an alternative embodiment, the component includes a conductive seed layer at an interior surface of the first opening and at least a portion of the first surface. The step of forming a first mask opening may expose portions of the seed layer within the peripheral openings, while other portions of the seed layer may remain covered by the mask layer. The step of forming electrical conductors includes forming the conductors on the exposed portions of the seed layer.

In an alternative embodiment, the step of forming the electrical conductors includes forming a seed layer on the exposed portions of the interior surfaces of the peripheral openings, and forming a plated metal layer on the seed layer.

In another embodiment, a dielectric layer may be deposited on the opposed first and second surfaces, and the exposed surfaces of the opening; a resist material may be deposited overlying the dielectric layer; resist openings may be created in the resist material using a mask overlying at least a part of the component opening; a metal seed layer may be deposited within the resist openings and through the element opening; metal conductors may be plated over the metal seed layer; and the resist material may be removed to expose surfaces of the metal conductors.

In another embodiment, the component opening has an area comprised of overlapping circles.

In another embodiment, the thickness of the component is less than 1000 microns between the first and second opposed surfaces.

BRIEF DESCRIPTION OF THE DRAWINGS

FIGS. 15, 15A, 15B, 15C, 15D, 15E, 15F, 15G, 15H, 15I, 15J, 15K, 15L, 15M, and 15N are various views illustrating a method of making an interconnection element in accordance with one embodiment of the present invention.

DETAILED DESCRIPTION

Figure 1:
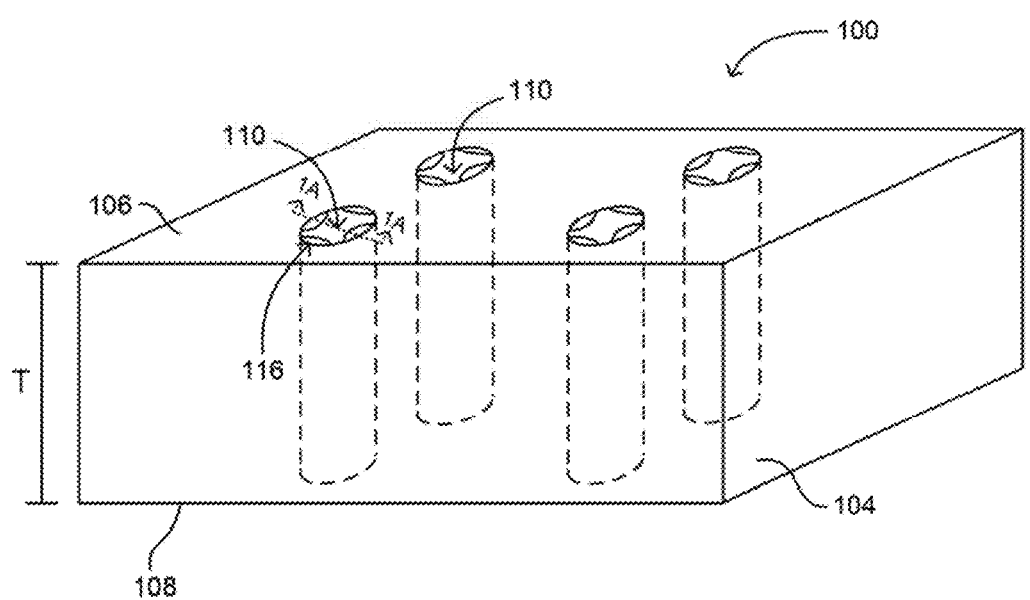
FIG. 1 is a perspective view of an interconnection component in accordance with one embodiment of the invention.

Referring to FIG. 1, there is shown a perspective view of an interconnection component 100 in accordance with an embodiment of the present invention. Interconnection component 100 includes a substrate or element 104 that has a first planar surface 106 and an opposed second planar surface 108.

In particular examples, the thickness T of substrate 104 in a direction orthogonal to and extending between the first and second surfaces 106,108, is less than 1000 microns, less than 500 microns, 200 microns or less, or in some cases 100 microns or less, 50 microns, or even smaller. The component may or may not incorporate electronic devices. In one embodiment, the component may incorporate passive devices, such as capacitors, resistors, inductors, or other devices or a combination of any of these devices.

In a particular embodiment, the component could be a microelectronic device having active devices embodied therein, such as a semiconductor chip, which can be an integrated circuit component, for example. In particular cases, the component may be rather thin, such as having a thickness of a few microns, or even less than one micron.

The substrate 104 may include or consist essentially of a continuous body of material having a low CTE, such as a semiconductor, e.g., silicon, glass, or ceramic material or liquid crystal polymer material, among others. In one example, the substrate may have a CTE of less than 10 parts per million per degree Celsius.

One or more openings 110 can extend between the first surface 106 and the second surface 108 of the substrate 104. A plurality of conductors 116 can extend through an opening 110 in the substrate 104, at least one of the conductors extending along at least the inner surface of the opening 110. Each conductor may extend between the first and second surfaces 106,108 of substrate 104, or extend beyond or away from either or both the first and second surfaces 106,108 of substrate 104. In one embodiment, the conductors 116 may be formed of Ni, Al, Cu, W, or alloys of any one or more of these metals. In one embodiment, the conductors may be formed by deposition, such as sputtering or any of a variety of vapor deposition techniques, or by plating. Alternatively, conductors 116 may be formed by conductive paste or a conductive matrix material which is deposited and sintered, such as described in commonly owned U.S. application Ser. No. 13/158,797 filed on Jun. 13, 2011, and entitled Flip Chip Assembly And Process With Sintering Material On Metal Bumps, the disclosure of which is incorporated herein by reference. In yet another variation, the conductors can be formed of a bond metal, such as solder, tin or indium.

Figure 1A:
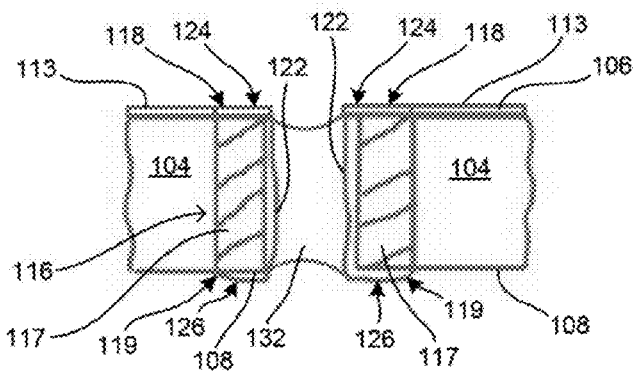
FIG. 1A is a cross-sectional portion of the embodiment of FIG. 1 taken along line 1A-1A.

With reference to FIG. 1A, a fragmentary cross-sectional view depicting one of the openings 110 in FIG. 1, a portion or all of a conductor can include a wettable layer 122 overlying a first metal layer 117. In one embodiment, the wettable layer 122 may be selected from an OSP, a metal or a conductive compound of a metal. In particular examples, without limitation, the wettable layer can be a clad layer of nickel, or an alloy of Nickel, such as, nickel-phosphorous (Ni—P), nickel-cobalt (Ni—Co), nickel-tungsten (Ni—W), cobalt-tungsten-phosphorus (Co—W—P), or cobalt-phosphorus (Co—P). In one example, a clad layer can be present, but need not be wettable. It is to be appreciated that in alternative embodiments, the conductors 116 may not have a clad layer covering portions of first metal layers 117 of the conductors 116.

With reference still to FIG. 1A, the conductors 116 may have first ends 118, and second ends 119 defining contacts exposed at the surfaces of the substrate. As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure may project from such surface; may be flush with such surface; or may be recessed relative to such surface and exposed through a hole or depression in the structure.

Figure 1B:
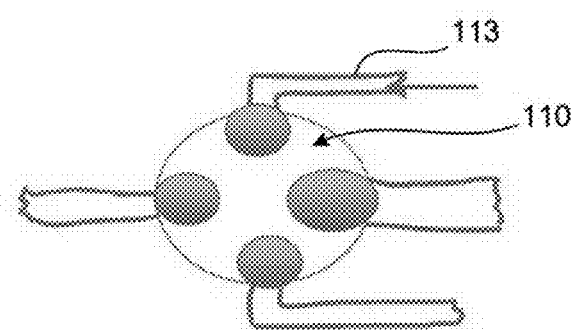
FIG. 1B is a top plan view of one of the openings in the embodiment of FIG. 1.

The first ends 118 of the conductors 116, which can include wettable layer 122, define a plurality of wettable first contacts 124 at the first surface 106 of substrate 104. The first contacts 124 may be at least partially aligned with the opening 110 in a direction of the thickness. The second ends 119 of the conductors 116 define a plurality of second contacts 126 exposed at the second surface 108 of substrate 104. Referring to FIG. 1B, traces 113 may extend from one or more conductors 116 along one or both surfaces 106,108 of the substrate. In the particular example shown, the first contacts 124 can be co-planar with the first surface and the second contacts 126 can be co-planar with the second surface 108.

Each of the conductors 116 can be electrically insulated from one another within an opening by being spaced apart from one another or by a dielectric layer 115 disposed between the conductors within a portion of or throughout the opening. In a particular embodiment, the dielectric layer 115 may be omitted such that the interior of the opening 110 may define a void which can be open to the plurality of conductors 116 within an opening 110. Such void may, in some cases, be evacuated or gas-filled, e.g., such as air-filled under typical atmospheric pressure and temperature conditions, for operation of an assembly which includes the interconnection component.

Figure 1C:
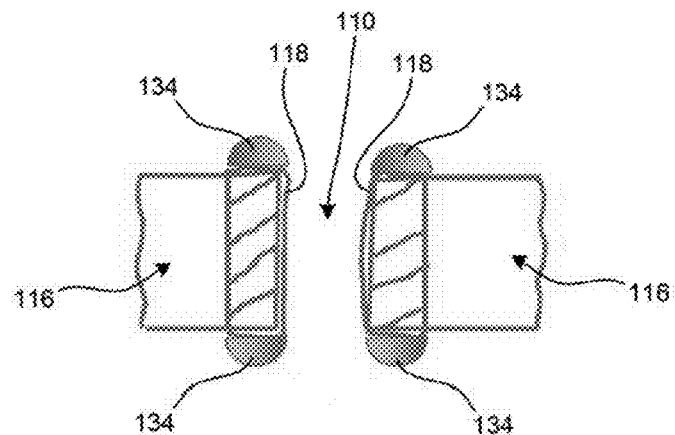
FIG. 1C is an alternative embodiment of FIG. 1A.

With reference to FIG. 1C, once the conductors 116 have been provided within the opening 110, a joining or bond metal which includes a mass of bond material 134 may be provided on either or both the first and second ends 118,120 of the conductor 116 to provide a bond and electrical interconnection between another device and substrate 104. In particular examples, the bond material can include tin or indium or solder, electrically conductive paste, e.g., solder paste, conductive matrix material, or metal nanoparticles, among others.

Figure 2:
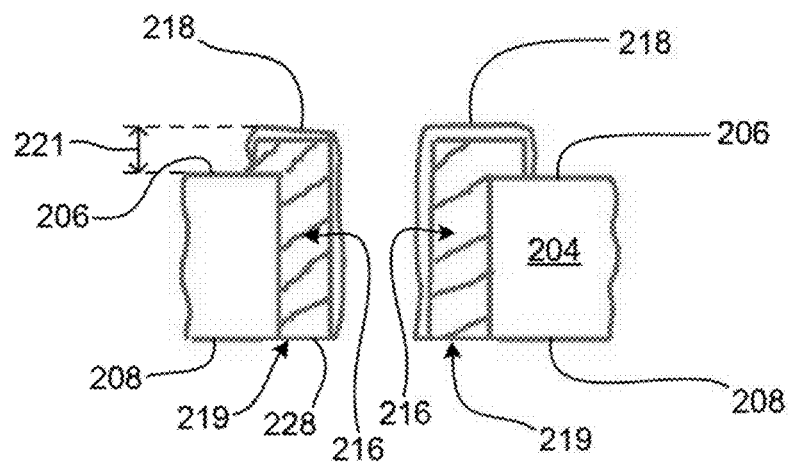
FIG. 2 is a cross-sectional view of an alternative embodiment of FIG. 1A.
Figure 2A:
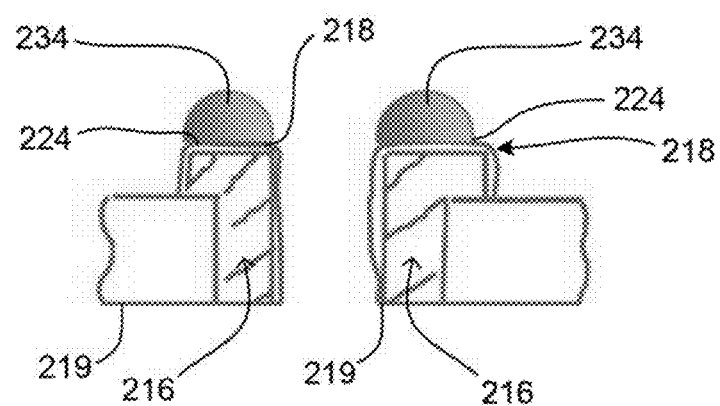
FIG. 2A is a cross-sectional view of an alternative embodiment of FIG. 1C.

Conductors need not always be planar or co-extensive with either or both the first and second surfaces 106,108 of substrate 104. Conductors 116 may instead extend beyond either or both of the first and second surfaces 106,108 of substrate 104. Referring to FIG. 2, a cross-sectional view of a portion of an alternative interconnection component illustrating such an alternative conductor 216 is shown. In this embodiment, the conductors 216 are not substantially planar or aligned with the first surface 206 of substrate 204. As shown, the first ends 218 of the conductors 216 extend to a height 221 above the first surface 206 of substrate 204, e.g., 5 to 20 microns (micrometers), whereas the second ends 219 of the conductors 216 are planar or aligned with the second surface 208 of substrate 204. The conductors 216 may project to any desired height away from the first surface 206 of substrate 204. In this example, the conductors 216 may project to a height H of at least 30 microns above the first surface 206. Turning to FIG. 2A, as in the above examples, masses of bond material 234 may be provided on the first ends 218 of the conductors 216. However, in the example of FIG. 2-2A, the wettable or clad layer may be present at first ends 218 of the conductors but not at the second ends 219. This structure can be provided, for example, when the bond material 234 is disposed on the first contacts 224 but not at second ends 219 of the conductors.

Figure 3:
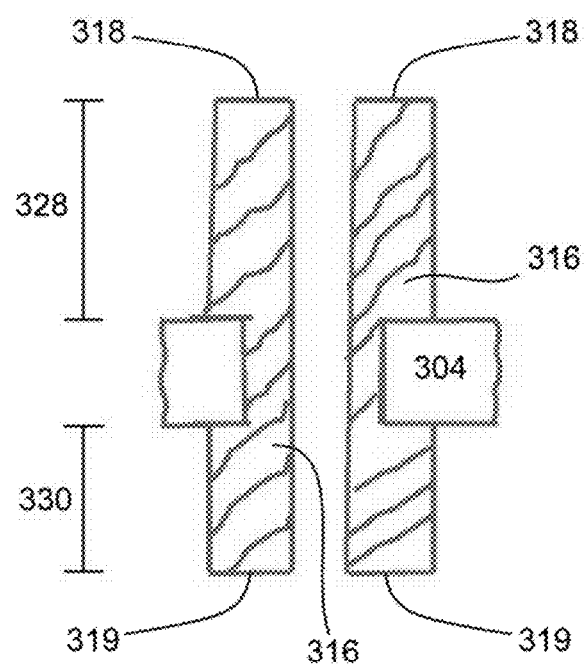
FIG. 3 is a cross-sectional view of an alternative embodiment of FIG. 1A.

In another example, as shown in FIG. 3, both the first and second ends 318,319 of conductors 316 may simultaneously project beyond the respective first and second surfaces 306, 308 of substrate 304. The first and second ends 318,319 of each of conductors 316 may project to the same heights 328,330 away from the respective surfaces, or the conductors 316 may have differing heights 328,330. In particular embodiments, the heights 328,330 can be greater than 10 microns, and one or more of the heights can range between 25 and 150 microns.

Figure 4:
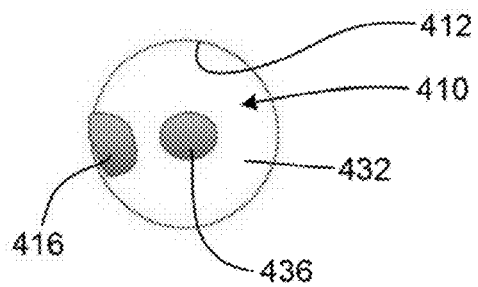
FIGS. 4, 4A, 4B, and 4C are respective top plan views of alternative embodiments of FIGS. 1A-1B.
Figure 4A:
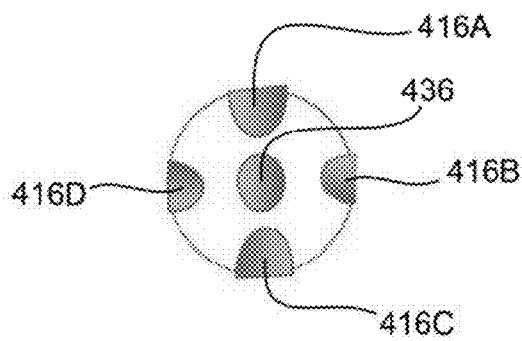
Figure 4B:
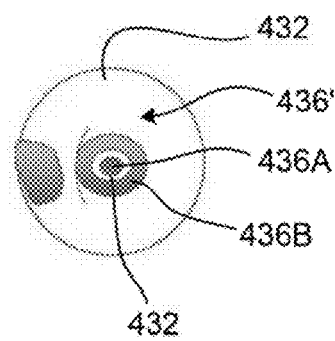

Turning now to FIGS. 4, 4A, and 4B, top plan views of alternative configurations of an interconnection component with a plurality of conductors within an opening are shown. It is to be appreciated that for ease of discussion, reference will be made only to variations in an openings and/or the conductor in the openings of an interconnection element, but except for a few examples, the body (substrate) of the interconnection component itself will not be shown. In several of these embodiments, a central conductor 436 extends between the first and second surfaces 406,408 of substrate 404 through a portion of the opening 410 that is spaced apart from a sidewall 412 of the opening. The central conductor may extend through a central portion of the opening in a direction along a centroid of the opening. Turning first to FIG. 4, there is shown a central conductor 436, as well as a single conductor 416 extending along the sidewall 412 of the opening 410. In this embodiment, a dielectric layer 432 extends within the voids or spaces not occupied by the central conductor 436 and conductor 416. The dielectric layer 432 may be disposed within the opening 410 and fill the space between the conductors 416,436 and sidewall 412 for electrical insulation between the conductors 416,436. The dielectric layer 432 may include a dielectric layer, such as those previously disclosed herein. In a particular embodiment, the dielectric layer 432 may also have a dielectric constant K of less than 2.0 and a Young's modulus lower than a Young's modulus of the plurality of conductors and/or the substrate. In one example, an insulating layer may be provided around the sidewall portions of the conductors to ensure the conductors are electrically insulated from one another.

Turning next to FIG. 4, instead of only a single conductor extending along the sidewall, a plurality of conductors 416A, 416B, 416C, 416D may extend along the sidewall 412 and around the central conductor 436. In another alternative embodiment of FIG. 4, the central conductor 436' of FIG. 4B may be comprised of two coaxial elements: a central core 436A and a sheath 436B coaxial with the central core 436A. The central core 436A may have a circular cross-section as shown and extend between the first and second surfaces (not shown) of a substrate (not shown). The sheath 436B may be spaced apart from and electrically insulated from the central core 436A by a dielectric layer 432 provided in the space between the core 436A and the sheath 436B. The dielectric layer 432 may also occupy portions of or fill the opening outside of the sheath 436B.

Figure 4C:
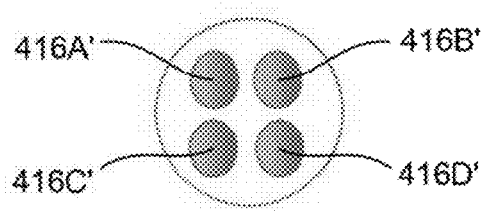

Turning next to FIG. 4C, a plurality of conductors 416A', 416B', 416C', 416D' extend between the first and second surfaces 406,408 of the substrate 404 and within the opening 410. None of the conductors 416A'-416D' extend along a sidewall 412, such that none of the conductors 416A', 416B', 416C', 416D' have contact with the sidewall 412 and are disposed at spaced apart positions within the opening 410. Moreover, unlike the embodiments of FIGS. 1-3 above, none of the conductors need have surfaces which conform to the contours of the interior surfaces of the opening. The conductors can be arranged at positions having uniform spacings. Alternatively, the conductors can be disposed at any positions, i.e., in which the spacings between adjacent ones of any of the conductors varies.

Figure 5:
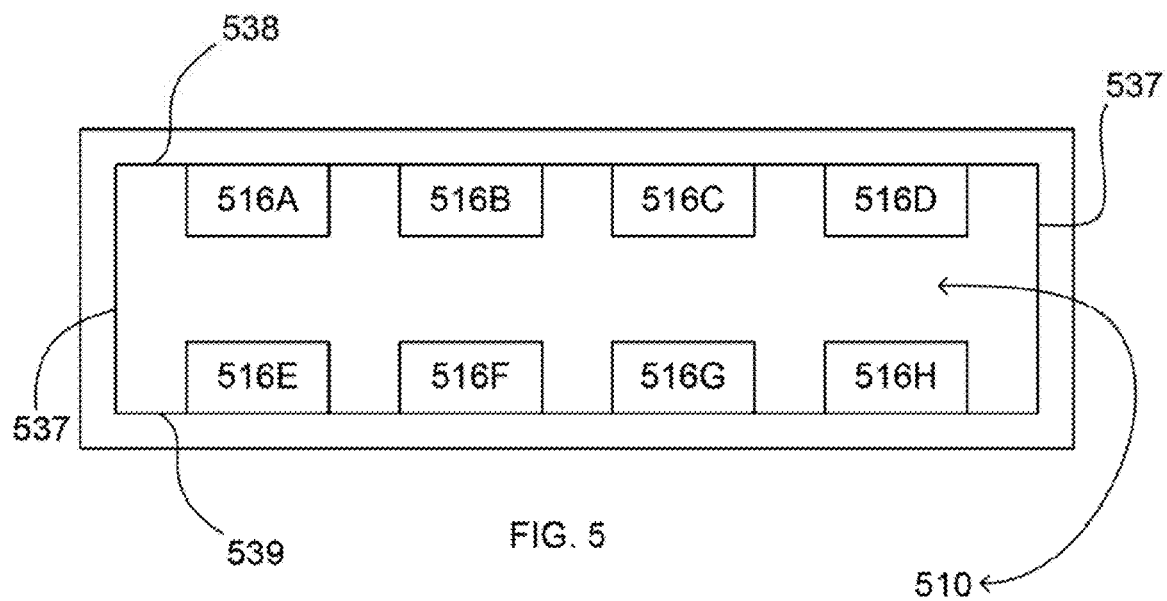
FIG. 5 is a top plan view of an alternative interconnection component in accordance with another embodiment.

The overall shape or geometry of the opening, as well as the conductor, may vary. Referring first to FIG. 5, the geometry or cross-section of the opening 510 and the conductors 516 may be rectangular. A rectangular cross-section may be desirable to reduce wave reflection and maintain signal integrity at the boundary between traces on the surface of a substrate and the conductor that extends through the opening. For example, use of a rectangular shape can produce results that may involve less loss; reduced jitter, and maintain signal profile, e.g., shape of the signal waveform. Furthermore, a rectangular cross-sectional opening may, in some cases, mitigate electrical resistance due to skin effect at higher operating frequencies, since rectangular conductors have a greater surface area than corresponding conductors of circular cross-section. Greater surface area conductors can result in lower resistance at high frequencies because, due to the skin effect, the current is concentrated at the surface rather than distributed evenly throughout the interior.

Figure 5A:
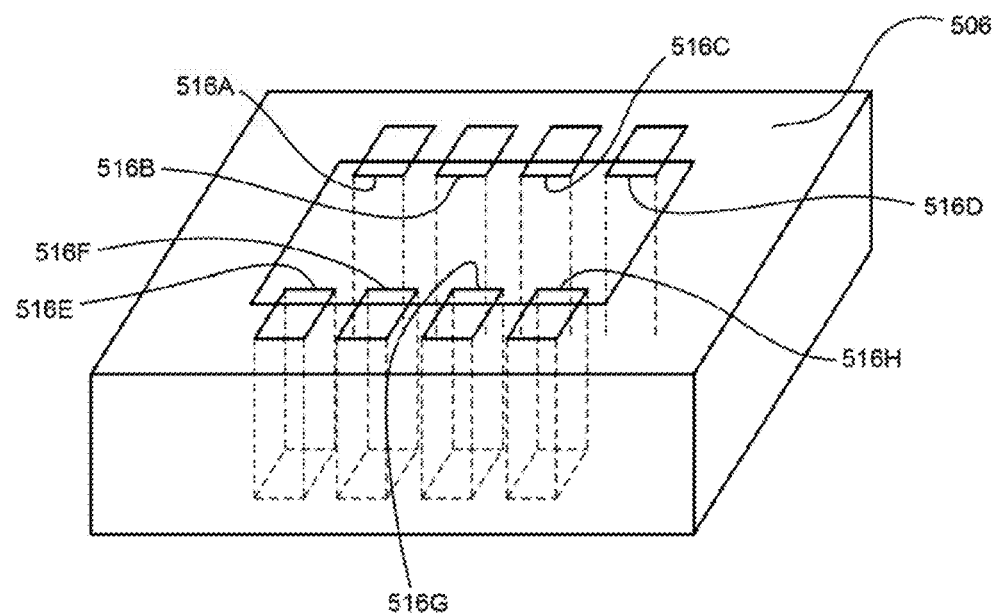
FIG. 5A is a top plan view of the interconnection component shown in FIG. 5.

Referring now to FIGS. 5-5A, rectangular opening 510 is shown, which may have a dielectric layer 532 lining interior surfaces thereof. The opening 510 may be positioned in a central portion or otherwise within the area bounded by peripheral edges of a first major surface of the interconnection component. In one embodiment, the rectangular opening may be large enough for a plurality of conductors to extend along a single sidewall 538 or 539. In this embodiment, four rectangular conductors 516A, 516B, 516C, 516D extend along a first sidewall 538 of the rectangular opening 510. Four rectangular conductors 516E, 516F, 516G, 516H may extend along the second sidewall 539 of the rectangular opening 510. The sidewalls 538,539 may have shorter or longer dimensions in the plane of the substrate (directions parallel to first surface 506) than sidewalls 512 which extend between sidewalls 538,539. In alternative embodiments, rectangular conductors can also be provided in an opening of any arbitrary shape, such as circular or oval.

Figure 5B:
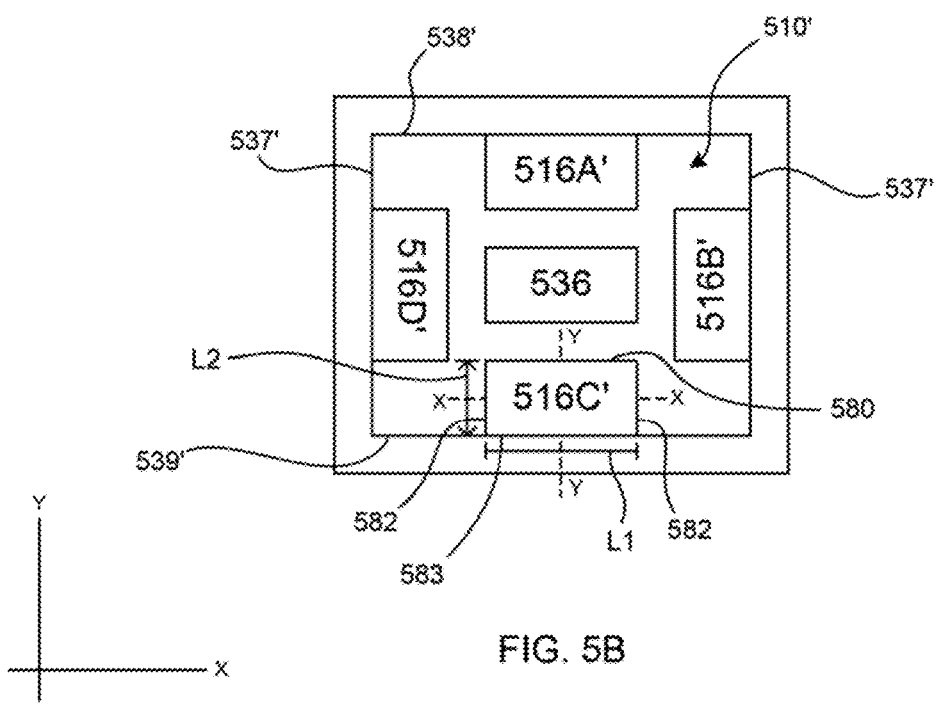
FIG. 5B is a top plan view of an alternative embodiment of FIGS. 5-5A.

Turning now to FIG. 5B, in an alternative embodiment, another rectangular opening 510' is shown. Rectangular conductors 516A',516B',516C',516D' extend along each of the sidewalls of the rectangular opening 510. A central rectangular conductor 536 can be positioned within the rectangular opening 510' at a position spaced apart from interior surfaces 538',539',537'. The conductor 536 may be disposed in a central portion of the opening. The central rectangular conductor 536 is disposed between each of the conductors 516A',516B', 516C', 516D' extending along the sidewalls. Conductors 516A',516B',516C',516D' may cooperatively function as a shield or sheathing element coaxial to central conductor 536. Cross-sectional dimensions of the conductors in any of the embodiments described above can be the same or can be different. For example, as shown in FIG. 5B, the conductor 516' has first opposed edges 583 extending along an axis x, that extends along the x-axis, and has a length L1 greater than the length L2 of second opposed edges 582 extending along an axis y, that extends along the y-axis. Additionally, in alternative embodiments, one or more of the conductors 516A', 516B',516C',516D' may have dimensions that differ from the other conductors.

Figure 6:
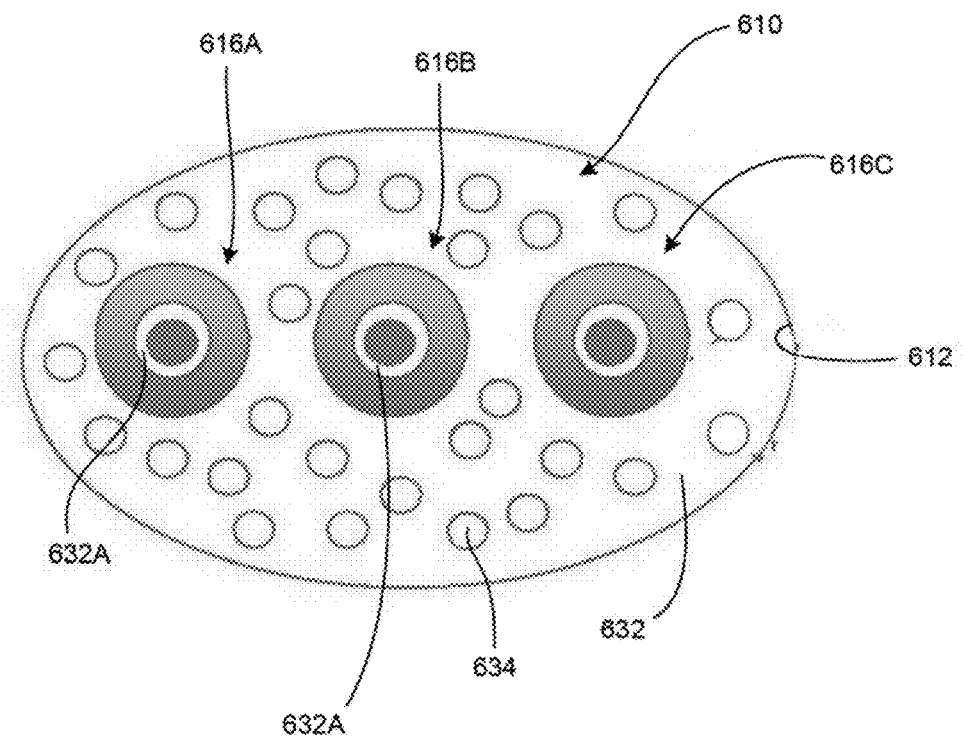
FIGS. 6, 6A, and 6B are top plan views of alternative embodiments of an opening in the interconnection component of FIG. 1.

With reference to FIG. 6, there is illustrated a top plan view of an opening of an interconnection component (not shown) in accordance with an embodiment, wherein the opening 610 extends between the first and second surfaces of a substrate (not shown). In a particular embodiment, the opening 610 may have an oval shape when viewed from the top surface (not shown) of an interconnection component (not shown). The opening 610 may include any shape of conductor disclosed herein. In this example, a plurality of coaxial conductors 616A, 616B, 616C extend along a central portion of the opening 610; none extend along a sidewall 612 of the opening 610. As shown, the space that is not occupied by the coaxial conductors 616 is filled with an insulating or dielectric layer 632. In a particular embodiment, the dielectric layer can be a low-K dielectric layer, e.g., having a dielectric constant K of less than 3.5, such as may be various polymeric materials. In some embodiments, this can reduce coupling of signals between conductors within the opening, thus reducing unwanted effects such as cross-talk.

The dielectric layer 632 may further include voids, e.g., gas-filled or evacuated regions or pores within the material. For example, voids or air pores 634 can be disposed within the insulating region that extends within the opening 610 and around each of the coaxial conductors 616A-C. The sizes of the voids, e.g., pores, can vary randomly. Average sizes of the voids can vary by design. Thus, in one example, the average sizes of the voids can be rather small, such as 1-2 nanometers in diameter. In other examples, the average sizes of the voids can range from about 10 nanometers to 100 nanometers. In a particular example, the average sizes of the voids can be about 20 nanometers and above.

In this example, use of porogen as the dielectric layer can generate pores when processed. Some of the air pores will be essentially empty. For example, the pores may be in a vacuum. Liquid crystal materials which are self-assembly materials are such an example.

The dielectric layer 632A between the inner and outer conductive portions of the coaxial conductors 616 can be the same as or different from dielectric layer 632.

Figure 6A:
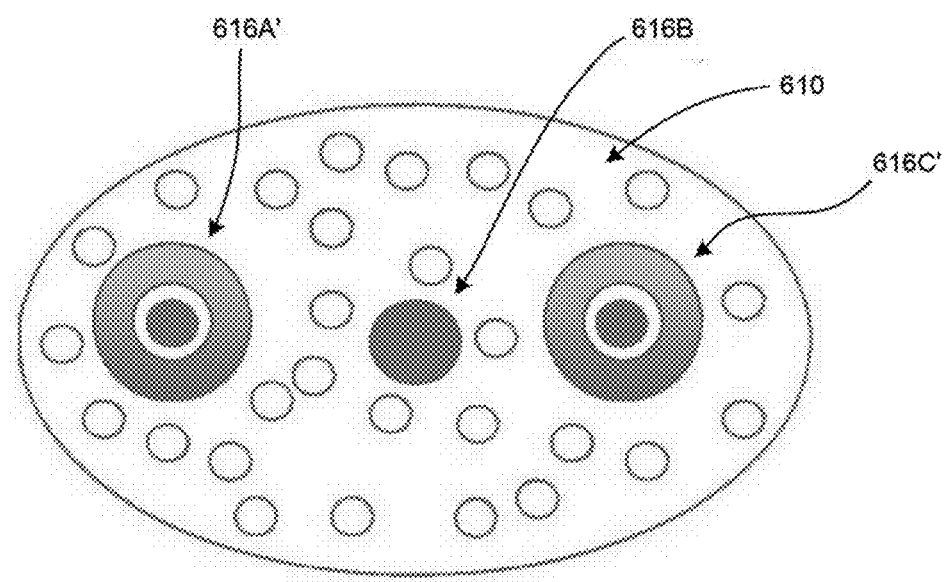
Figure 6B:
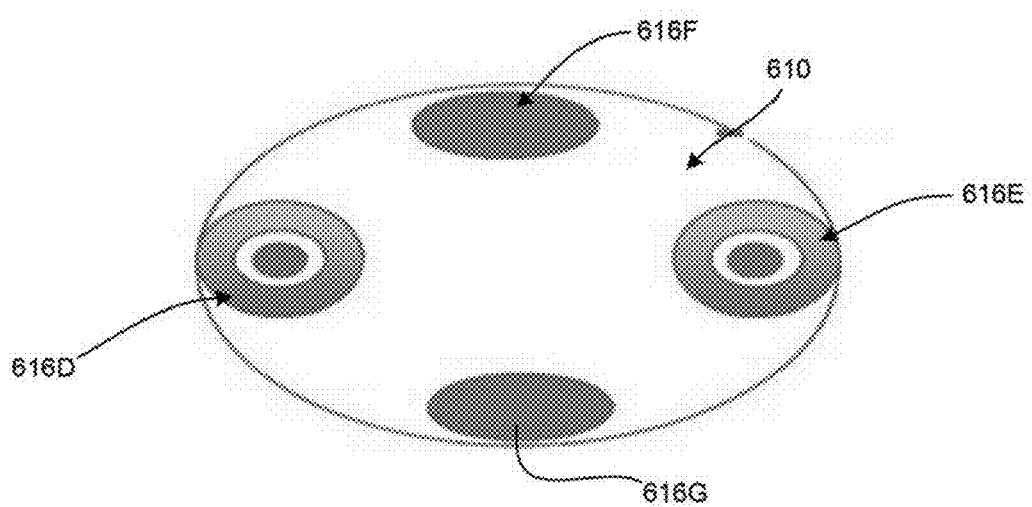

In one alternative arrangement of the conductors within an opening, as shown in FIG. 6A, there may be two coaxial conductors 616A',616C' and a solid central conductor 616B. In one embodiment, the opening may be non-circular shaped and the solid central conductor 616B may be positioned between the two coaxial conductors 616A',616C', so that both the solid central conductor and the coaxial conductors are aligned and extend across the central portion of the opening 610. In another alternative arrangement, as shown in FIG. 6B, opposed coaxial conductive elements 616D,616E, each having a conductive core and a sheath as described above, may have surfaces extending along a well of the opening 610, and opposed solid (or non-coaxial) conductors 616F,616G may extend along the wall of the opening 610 at opposed locations spaced apart from the coaxial conductive elements 616,616E.

Depending upon particular design requirements, the cross-sectional dimensions of the conductors in any of the embodiments described above can be the same, or can be different.

Figure 7:
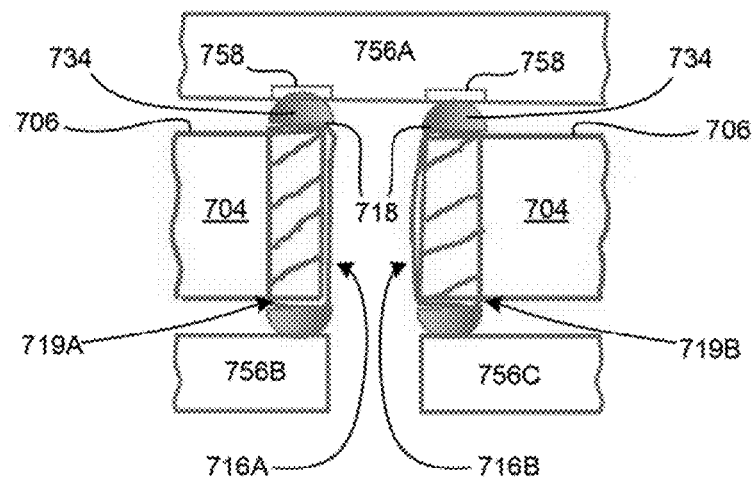
FIG. 7 is a cross-sectional view of the interconnection component shown in FIGS. 1 and 1C connected to an external microelectronic element.

Referring now to FIG. 7, any of the aforementioned interconnection components may be joined and electrically connected with other devices at either or both ends of the conductors. For example, as shown, a first microelectronic element 756A has bond pads 758 exposed at a front face thereof that faces the first surface 706 of the substrate 704. The microelectronic element 756A can be joined to bonding material, such as solder 734, exposed at the first ends 718 of the conductors 716A,716B. Second and third microelectronic elements 756B,756C may be similarly joined to solder 734 positioned at the second ends 719A of conductors 716A, and second ends 719B of conductors 716B.

Figure 7A:
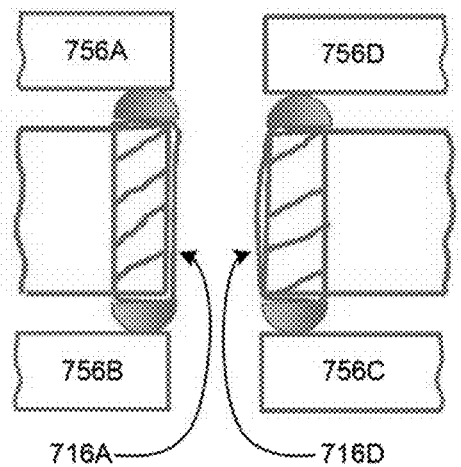
FIG. 7A is a cross-sectional view of an alternative embodiment of FIG. 7.

Similarly, with reference to FIG. 7A, instead of first microelectronic element 756A contacting both conductors 716A, 717B, the first microelectronic element 756A may contact only conductor 716A, and a fourth microelectronic element 756D may be provided at the second end of the conductors that have bond pads facing the first surface of the substrate. The contacts of the second microelectronic elements may be joined to corresponding ones of the second contacts through masses of bond material. It is to be appreciated that the first and second microelectronic element need not both be active chips, but may be passive components.

Numerous structural configurations for interconnection components having one or more openings and a plurality of conductors within the one or more openings can be made in accordance with one or more of the above-described embodiments or by combining principles from one or more of the above-described embodiments. It is intended that the structures of any of the above-described embodiments can be combined to the fullest extent possible. In addition, the interconnection component can be incorporated in a microelectronic package or an assembly including a microelectronic element or a microelectronic package in any configuration. The shape and size of the opening in the substrate may vary, as well as the shape and size and placement of conductors within the opening. There may be as few as two conductors within an opening or as many conductors that are capable of fitting within the opening. The conductor may have a cross-section that is round, oval, rectangular, or any other desirable shape. The conductors may be a coaxial conductor, and positioned adjacent the sidewall or away from the sidewall. The conductors may be staggered or aligned, or placed in any desirable configuration. Thus, numerous variations of interconnection components and microelectronic packages incorporating such interconnection components may be manufactured based upon the principles disclosed herein.

Figure 8:
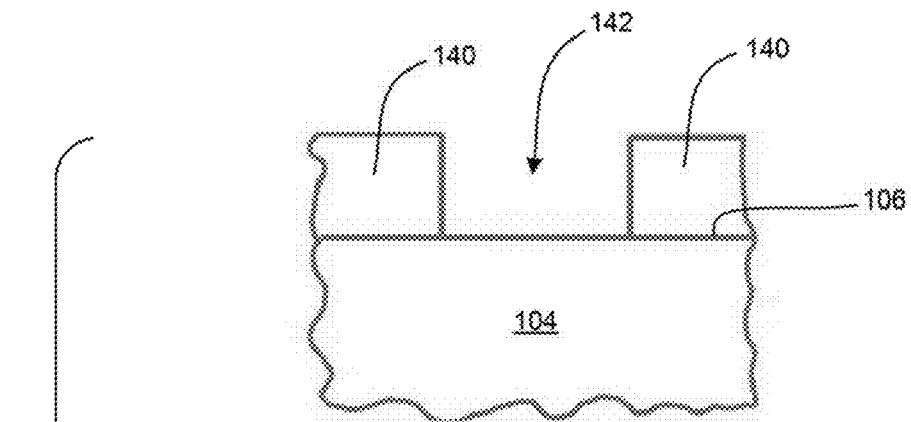
FIGS. 8, 8A, 8B, 8C, 8D, 8E, 8F, 8G, and 8H are cross-sectional views of the method steps of making the interconnection component in accordance with one embodiment.
Figure 8A:
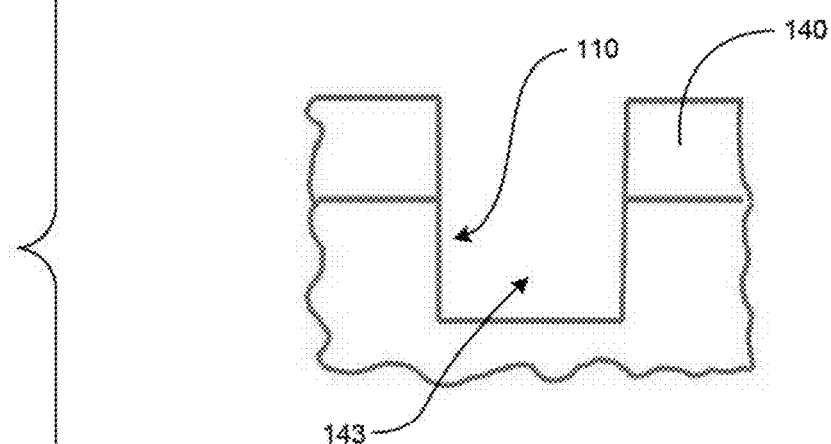
Figure 8B:
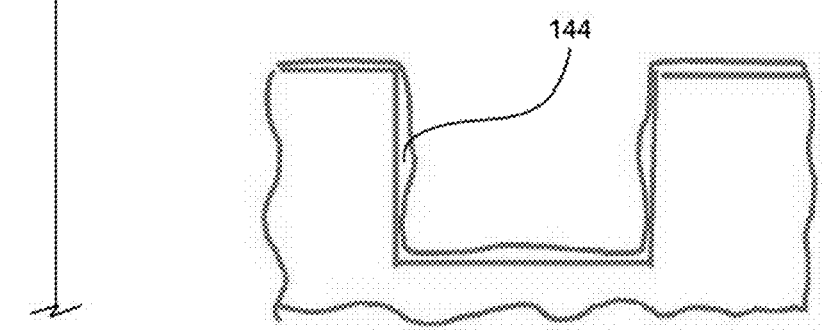
Figure 8C:
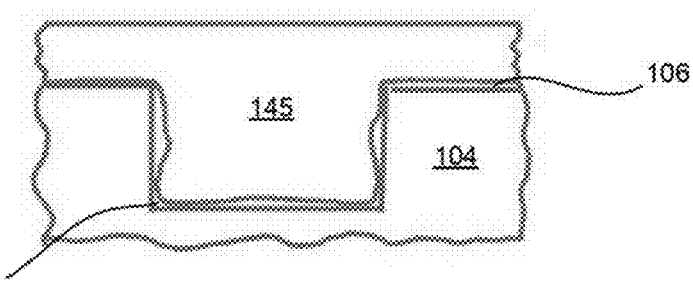
Figure 8D:
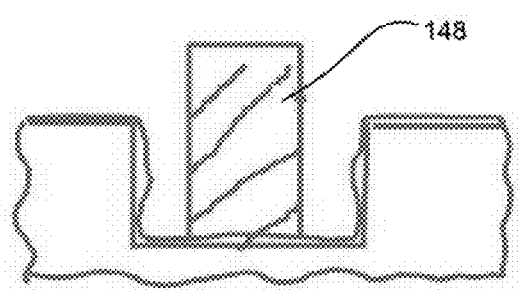
Figure 8E:
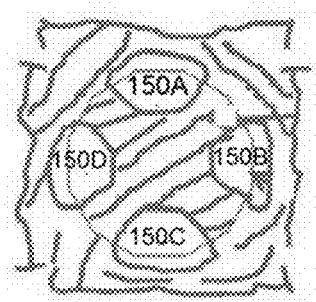
Figure 8F:
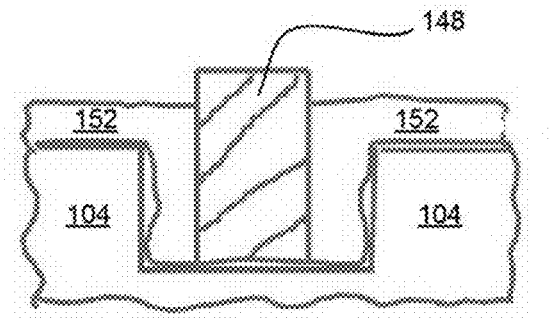
Figure 8G:
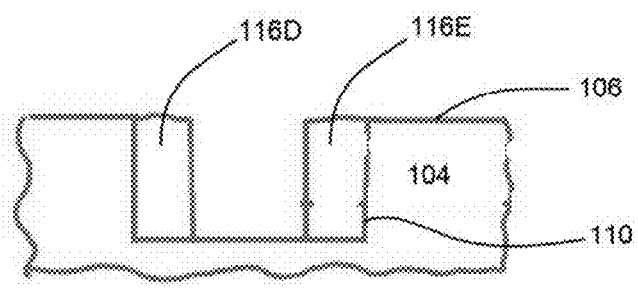
Figure 8H:
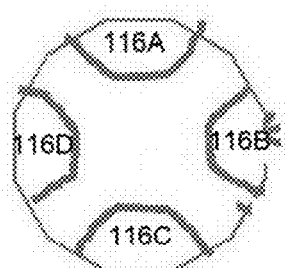

Referring now to FIGS. 8-11C, various methods of making the aforementioned interconnection components will be discussed. Turning first to FIGS. 8-8H, in one embodiment of a method of making the interconnection component 100 shown in FIG. 1, a cross-sectional portion of a substrate 104 is shown. Referring first to FIG. 8, a substrate 104 having a first surface 106, which typically is a major surface of the substrate, is shown with a first resist material 140 patterned thereon. The first resist material 140 may be comprised of resist materials known in the art. The first resist material 140 may be patterned to provide resist openings 142 or recesses within the first resist material 140. Using the first resist material 140 as a mask, as shown in FIG. 8A, the substrate 104 may be patterned to provide a corresponding opening 110 in the substrate that is aligned with the opening in the resist material. The substrate recess 110 can be created using known processes, such as etching, milling, wet or dry blasting, ablation or other techniques. Referring to FIG. 8B, the first resist material 140 may then be removed from the substrate 104 and a barrier or adhesion layer and seed layer coating 144 may be provided on the exposed surfaces of the substrate 104. Referring to FIGS. 8C-8D, a second resist material 145 may be deposited into the opening 110 within the substrate 104, as well as onto the first surface 106 of the substrate 104. The second resist material 146 is then patterned to provide a columnar resist pillar 148 within opening 110. (See FIG. 8D.) The patterning of the second resist material 146 will further provide one or more voids 150A-D or cavities within the opening 110, as also shown in FIG. 8E, a top view of the patterned resist and the resulting cavities. A metal 152 may then be plated or otherwise deposited into voids 150A-150D in the opening 110 that are not occupied by resist pillar 148, as shown in FIG. 8F. Turning to FIGS. 8G and 8H (as well as FIG. 1B), the resist pillar 148 may be removed to expose metal conductors 116D,116E extending along at least a portion of the sidewall 112 of the openings 110. The deposited metal 152 overlying the first surface 106 can be removed where necessary by subsequent processing, such as etching, ablation, grinding, lapping or polishing. The second surface (not shown) of the substrate 104 may be patterned to provide for an opening at the second surface (not shown) of the substrate 104.

Figure 9:
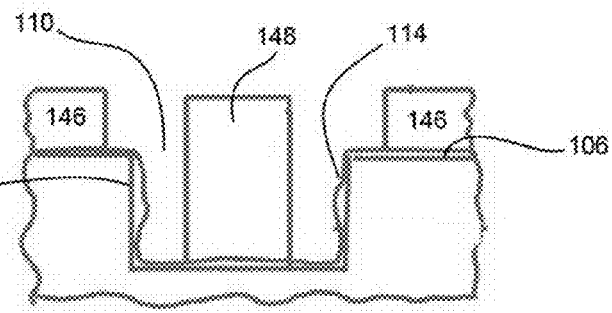
FIGS. 9, 9A, 9B, and 9C are cross-sectional views of a method of forming conductors within an interconnection component according to an alternative embodiment.
Figure 9A:
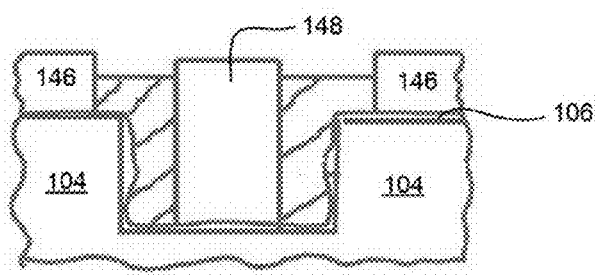
Figure 9B:
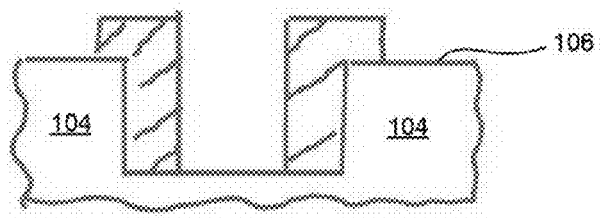
Figure 9C:
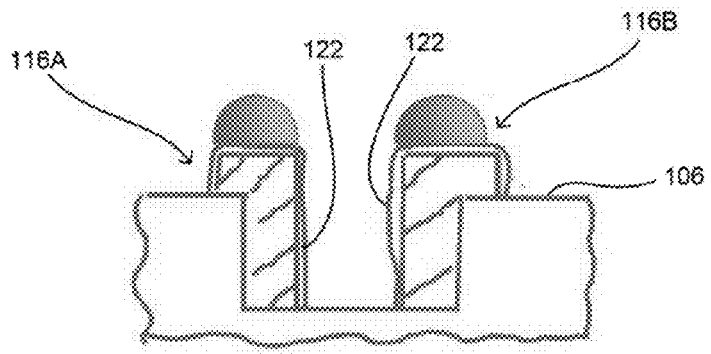

Referring now to FIGS. 9-9C, a method for constructing an interconnection component with conductors in an opening that project beyond one or more surfaces of the substrate, such as the conductors described in FIG. 2, is shown. Turning first to FIG. 9, after the step of providing a second resist material 145 within the opening 110 of the substrate and on the first surface of the substrate 104 (See FIG. 8D), the resist may be patterned to provide a resist pillar 148 within opening 110, as well as resist pattern 146 on the first surface 106 of the substrate 104. As shown, the resist pattern 146 is spaced away from the outer peripheral edge 114 of the opening 110. Referring to FIG. 9A, a metal is plated or otherwise deposited within one or more openings defined by the patterned resist material 146,148. Thereafter, as shown in FIG. 9B, the resist pillar 148 and resist pattern 146 on the first surface 106 of the substrate 104 can be removed to provide first and second conductors 116A,116B projecting above the first surface 106 of the substrate 104, as well as third and fourth conductors (not shown). A wettable layer 122 (FIG. 9C) may also be provided as part of the conductors 116A,116B. Bonding material may then be provided over the wettable layer 122 of the conductors 116A,116B. Thereafter, an opening may be provided through the second surface (not shown) of the substrate (not shown) to provide a through via.

Figure 10:
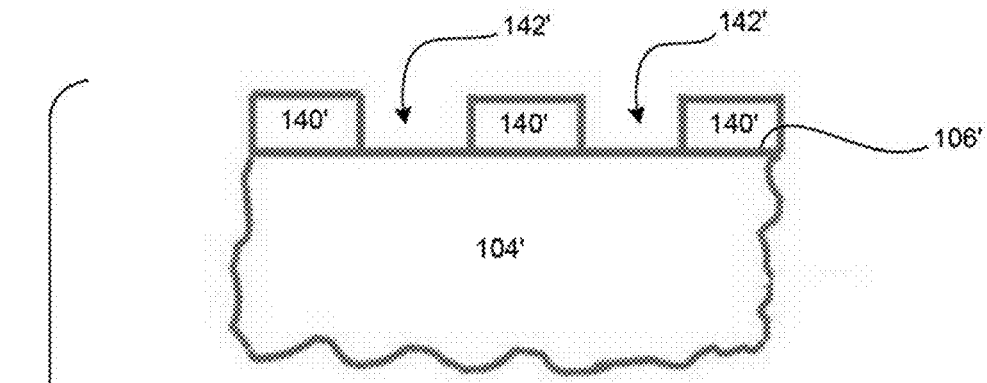
FIGS. 10, 10A, 10B, 10C, 10D, 10E, 10F, 10G, and 10H illustrate a method of forming conductors within an opening of an interconnection component in accordance with another alternative embodiment.
Figure 10A:
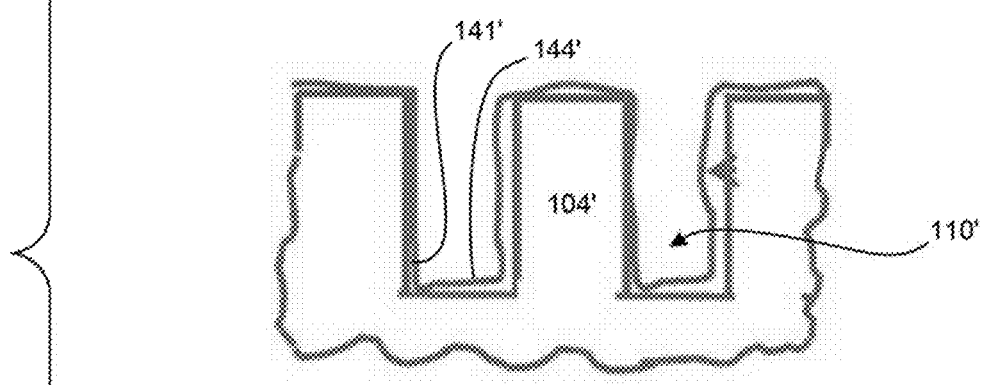
Figure 10B:
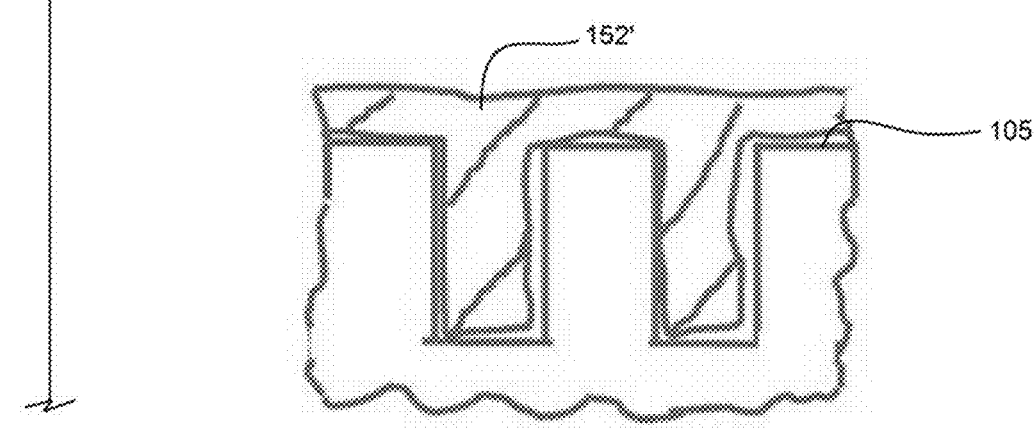
Figure 10C:
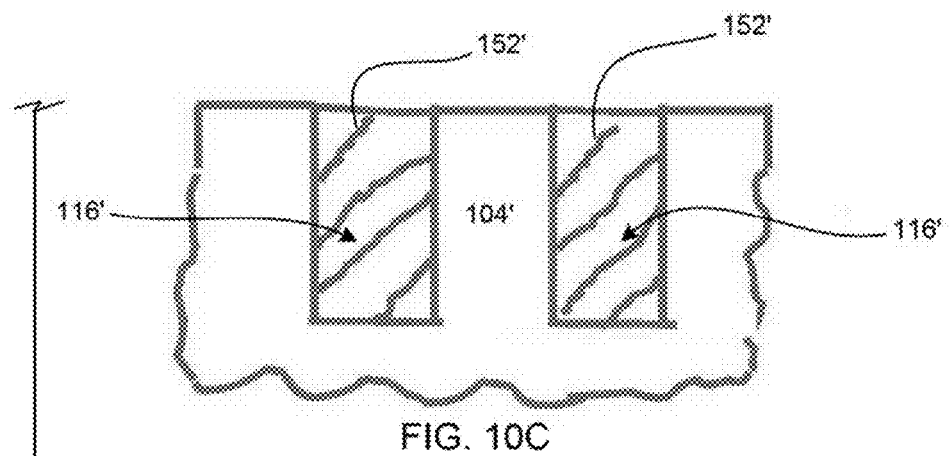
Figure 10D:
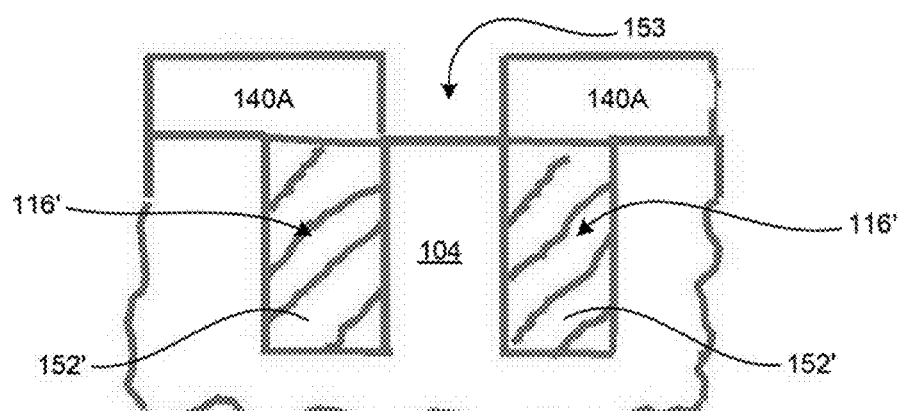
Figure 10E:
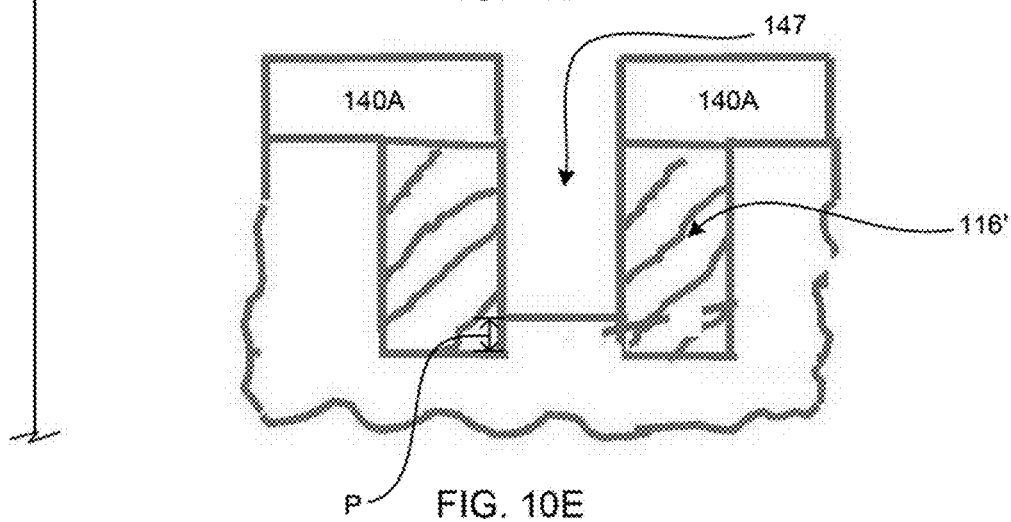
Figure 10F:
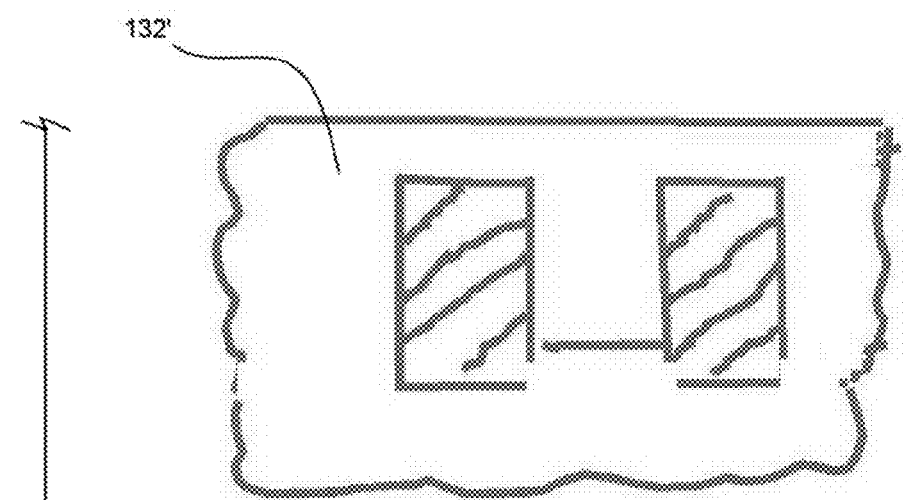
Figure 10G:
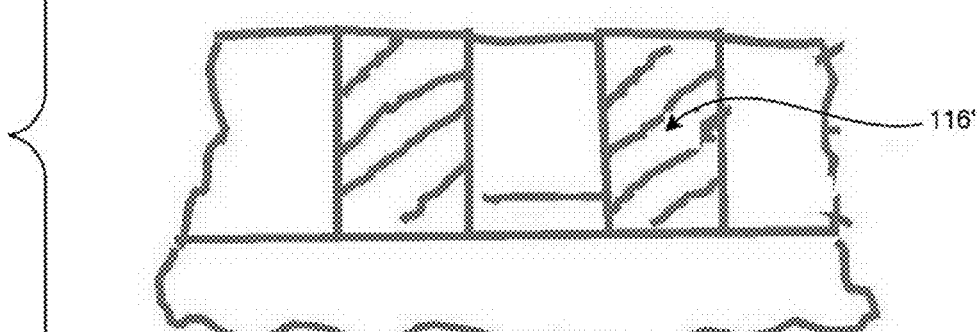
Figure 10H:
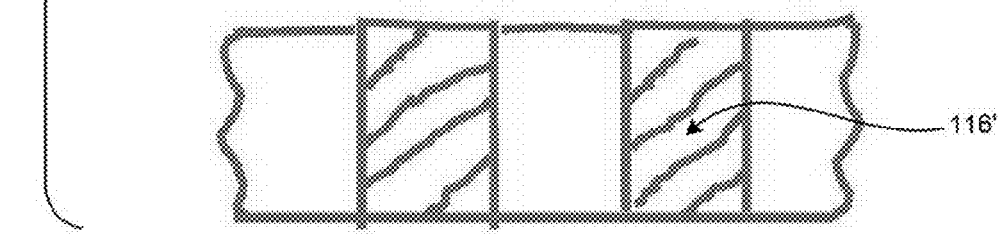
Figure 10I:
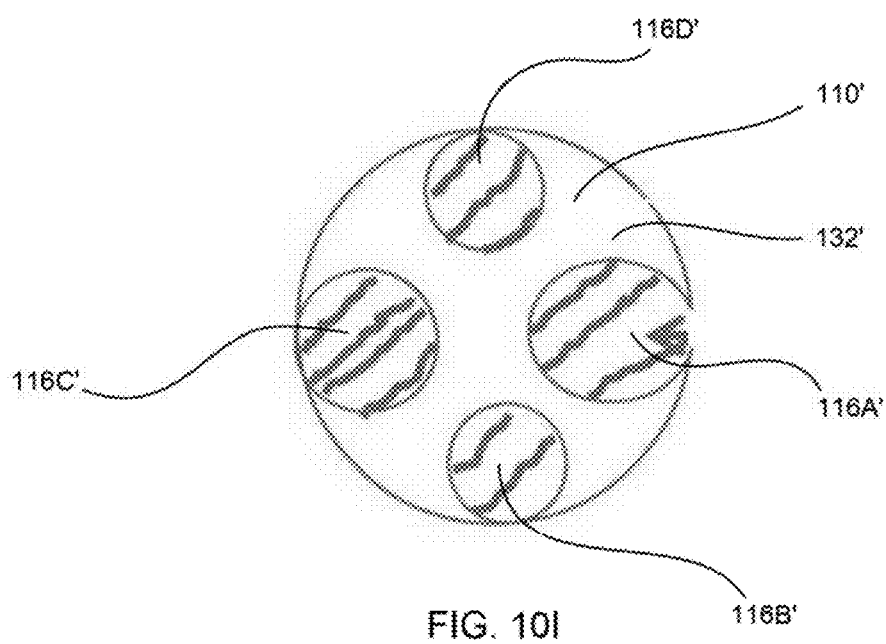
FIG. 10I is a top plan view of the interconnection component shown in FIG. 10H.

With reference to FIGS. 10-10I, an alternative embodiment is described for forming an interconnection component, such as interconnection component 100 (see FIG. 1). Turning first to FIG. 10, a substrate 104' is shown with a first mask 140' patterned on the first surface 106' of the substrate 104'. As in the previous embodiments, the patterning of the mask 140' can include patterning openings 142' in a layer of photoresist. With reference to FIG. 10A, using the mask 140' as a mask, the substrate 104' may be patterned to provide openings 110' in the substrate that are aligned with the openings 142' in the mask. As shown, a seed layer 144 and/or an adhesion barrier layer may be provided over the exposed surfaces 141' of the patterned substrate. The substrate opening 110' may then be filled with a plated metal 152', as shown in FIG. 10B. In this embodiment, the plated metal 152' may overlie the exposed surfaces 105 of the substrate 104'. The resulting structure may then be planarized, e.g., by grinding, lapping or polishing, as shown in FIG. 10C, so that at least one surface of the plated metal 152' and one surface of the substrate 104' are substantially co-planar. This can also result in the formation of conductors 116'. Referring to FIG. 10D, a second mask material 140A, e.g., a photoresist, may be provided over the planarized substrate and patterned to provide a first resist opening 153 therein. The substrate 104 may be again patterned to form a second resist opening 147 between the conductors 116. Turning to FIG. 10E, a portion of the substrate 104 extending below the second resist opening 147 and between the conductors 116 may then be patterned to leave only a residual portion P of substrate material remaining between the conductors 116'. Thereafter, a low K dielectric layer 132' may be deposited on the substrate to fill the openings, as shown in FIG. 10F. This resulting structure may then be planarized, as shown in FIGS. 10G and 10H, so that the plated metal or conductors 116' and the dielectric layer are co-planar. Turning to FIG. 10I, in an example of a structure so formed, a top view of the opening 110' with conductors 116A', 116B', 116C', 116D' and a low K dielectric layer 132' is shown. It is to be appreciated that the patterning of the first and second masks and the conductors 116 can be provided to result in any number of conductor configurations, such as those previously discussed in FIGS. 1-8.

Figure 11:
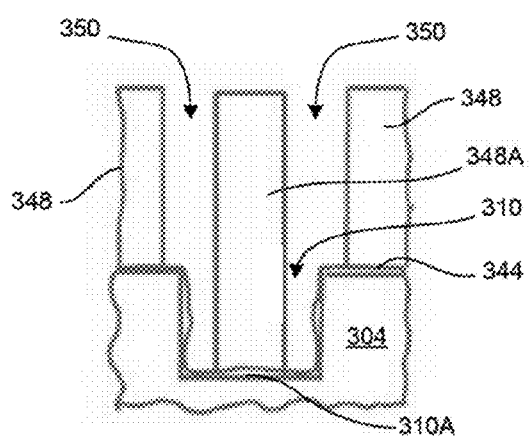
FIGS. 11, 11A, 11B, and 11C are cross-sectional views of a method of forming conductors within an opening of an interconnection component in accordance with an alternative embodiment.
Figure 11A:
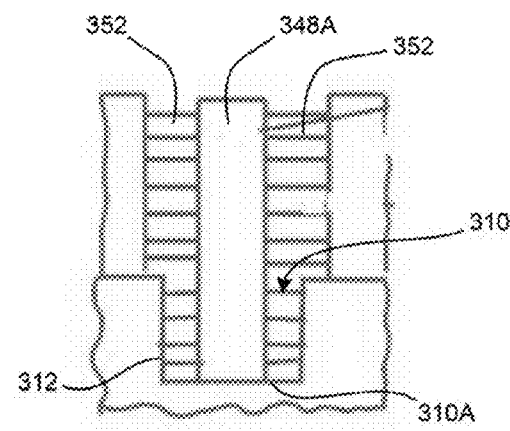
Figure 11B:
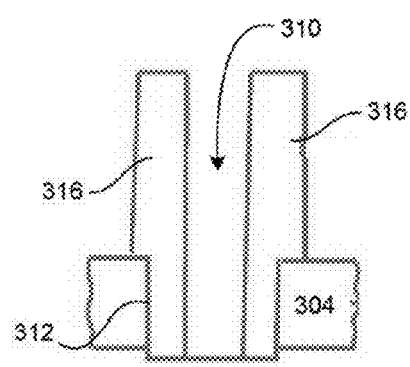
Figure 11C:
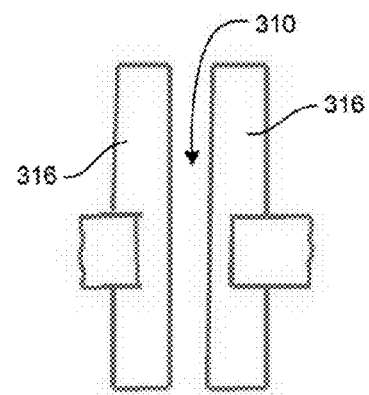

FIGS. 11-11C illustrate one embodiment of a method of forming an interconnection component having openings with conductors extending therethrough, such as shown in FIG. 3. Referring first to FIG. 11, the steps of patterning a resist mask on the substrate 304; providing corresponding openings 143 in the substrate 304; and providing a barrier layer 344 overlying the substrate 304 have been accomplished. As shown, another resist mask overlying the substrate has been patterned to provide resist pillars 348,348A and voids 350. In this embodiment, a central columnar resist pillar 348A can extend from the base 310A of the opening 310 in the substrate 304. Turning to FIG. 11A, a metal 352 can be provided within the voids 350 created between each of the resist pillars 348,348A. In an exemplary embodiment, the metal 352 may be plated within the void 350, but any means of providing metal 352 within the void 350 may be used. As shown in FIG. 11B, the resist pillars 348 are removed to expose metal conductors 316 extending along at least a portion of the sidewall 312 of the openings 310. In this embodiment, the second surface (not shown) of the substrate 304, including the base 310A of the substrate may be patterned or removed. This will provide for the conductors to extend beyond the opposed surfaces of the substrate 304. The resulting structure, shown in FIG. 11C is therefore a substrate with first and second surfaces having conductors with first and second ends extending beyond the first and second surfaces of the substrate.

Figure 12:
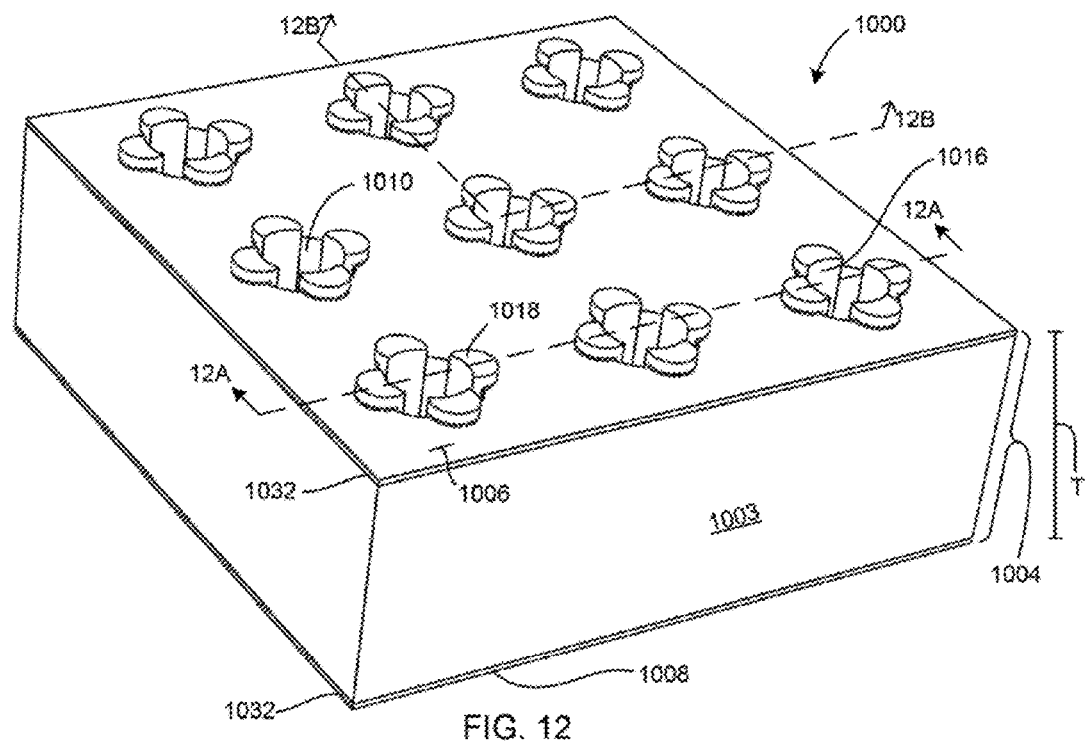
FIG. 12 is a perspective view of an interconnection component according to an alternative embodiment.

Referring now to FIGS. 12-15, alternative interconnection components having openings with conductors extending therethrough, as well as methods for making such interconnection components, are described. Turning first to FIG. 12, a perspective view of an interconnection component 1000 is shown. Interconnection component 1000 includes a substrate or element 1004 with a first surface 1006 and a second surface 1008. In this embodiment, substrate 1004 includes substrate base 1003 and dielectric layers 1032 provided at the outermost portions of substrate base 1003. The presence of a dielectric layer 1032 as part of the substrate is optional and largely depends on the material selected for the substrate base 1003. If the substrate base 1003 possesses insulative properties, it may be unnecessary to provide an additional dielectric layer 1032. As previously discussed, substrate 1004 is primarily a low CTE substrate comprised of semiconductor material, e.g., silicon, glass, or ceramic material or liquid crystal polymer material, among others. Substrate 1004 also has a thickness T as previously disclosed herein.

One or more openings 1010 extend between the first surface 1006 and second surface 1008 of the substrate 1004. One or more of the openings 1010 may have a circular cross-section. (See also FIG. 14C.) In preferred examples, the openings 1010 have a diameter D ranging from 0.5-50 microns.

Figure 12B:
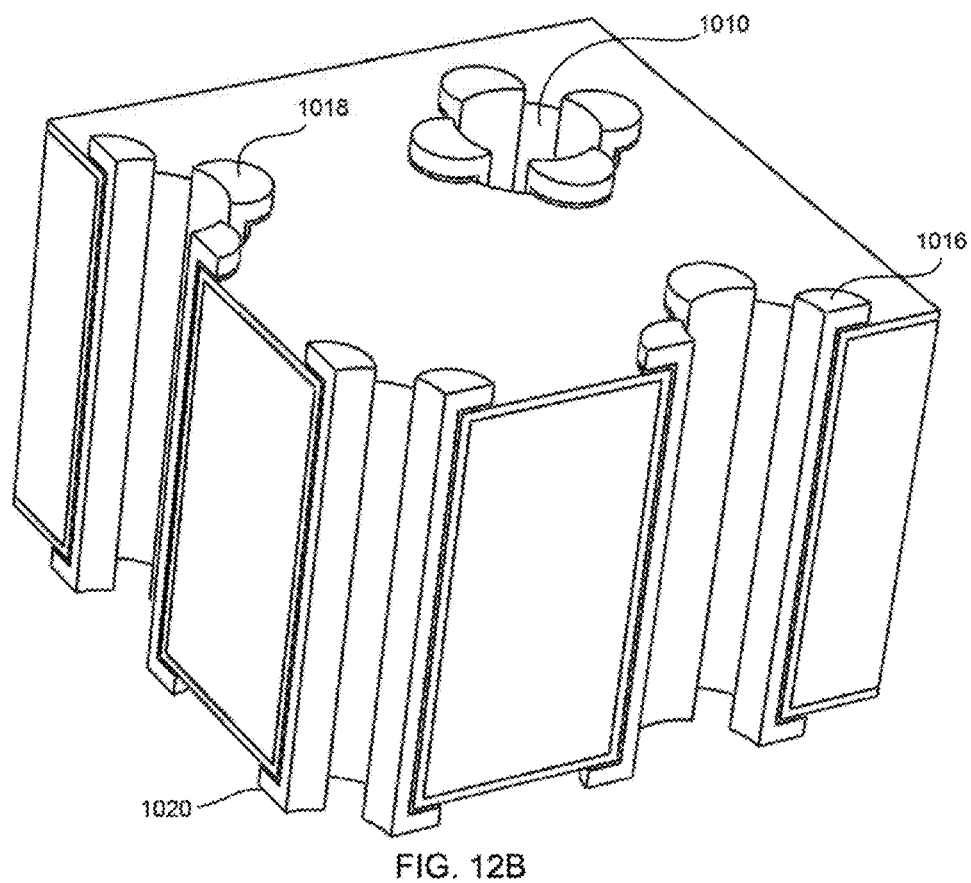
FIG. 12B is a cross-sectional view of FIG. 12 taken along line 12B-12B.
Figure 12A:
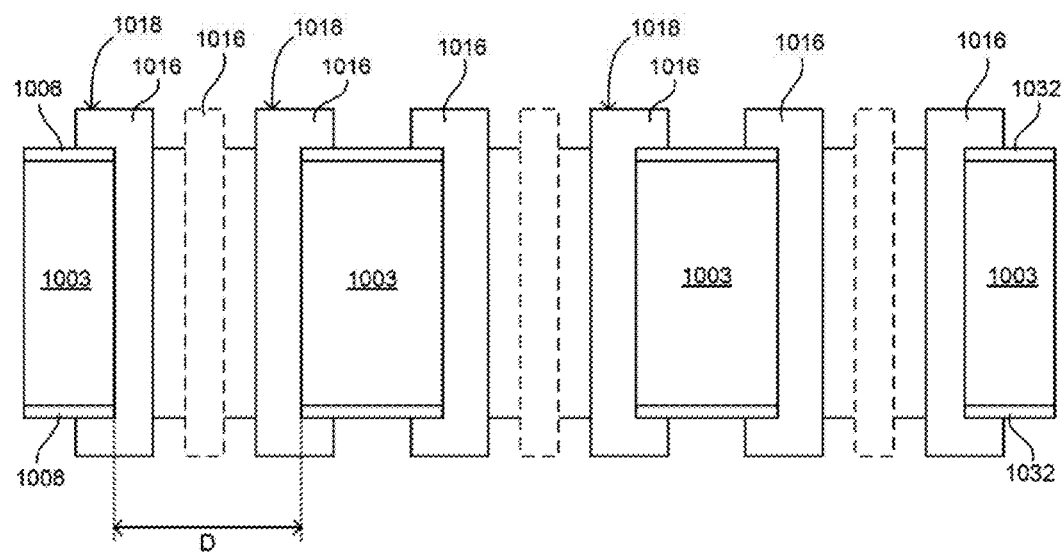
FIG. 12A is perspective cross-sectional view of the interconnection component of FIG. 12 taken along line 12A-12A.

Turning to FIG. 12A, a cross-sectional view of FIG. 12 taken along line 12A-12A, and FIG. 12B, a cross-sectional view of FIG. 12 taken along line 12B-12B, one or more conductors 1016 can extend through the openings 1010. In this exemplary example, the conductors 1016 extend along and through the length of the openings 1010. As shown, the conductors 1016 are spaced apart from one another so that they do not contact one another. Alternatively, the opening 1010 may be filled with an intermediate dielectric layer, as previously disclosed herein. First ends 1018 of the conductors 1016 extend onto the first surface 1006 and second surface 1008 of the substrate 1004. In an exemplary embodiment, four conductors 1016 extend through each opening 1010. As best shown in FIG. 12, first ends 1018 of the conductors 1016 may be flat pads having a semi-circular shape, although conductors 1016 can be patterned to take on any desired shape.

Figure 13:
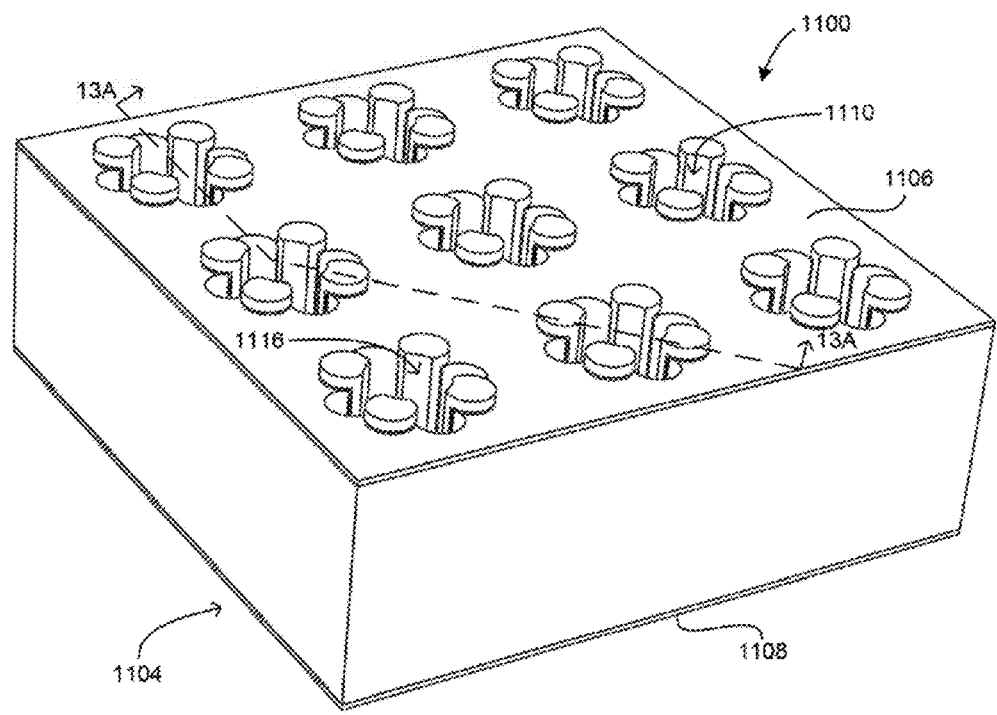
FIG. 13 is a perspective view of an interconnection component formed in accordance with an alternative embodiment.
Figure 13A:
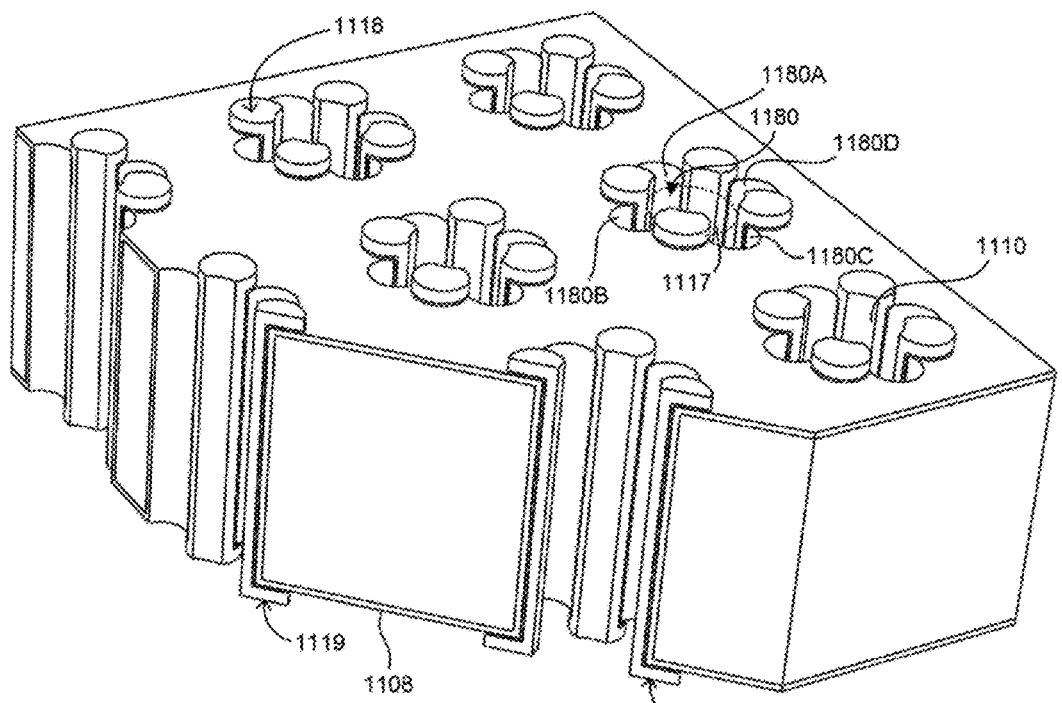
FIG. 13A is a cross-sectional view of FIG. 13 taken along line 13A-13A.

Referring now to FIGS. 13-13A, this embodiment is similar to the embodiment shown in FIG. 12, and differs with respect to the shape of the openings 1110 extending through the substrate 1104 and the arrangement of conductors 1116 within the opening. As in the previous embodiment, four conductors 1116 are shown extending through openings 1110. First ends 1118 of the conductors 1116 extend onto the first surface 1106 of the substrate 1104 and second ends 1119 extend onto the second surface 1108. As will be discussed in greater detail (see FIG. 15A), one or more of the openings 1110 is comprised of a central circular cylindrical opening 1180 having a circumferential edge 1117 and a series of circular cylindrical peripheral openings 1180A, 1180B, 1180C,1180D that overlap the circumferential edge 1117 of the central opening 1180. One or more of the openings 1180 may also be spaced apart from one another along the circumferential edge 1117 of the central circular opening 1180. Each of the openings 1110 and peripheral openings 1180A, 1180B, 1180C, 1180D extend through a thickness of the substrate 1104 and at least some of the conductors extend along inner surfaces of the peripheral openings 1180A, 1180B, 1180C, 1180D.

Figure 14:
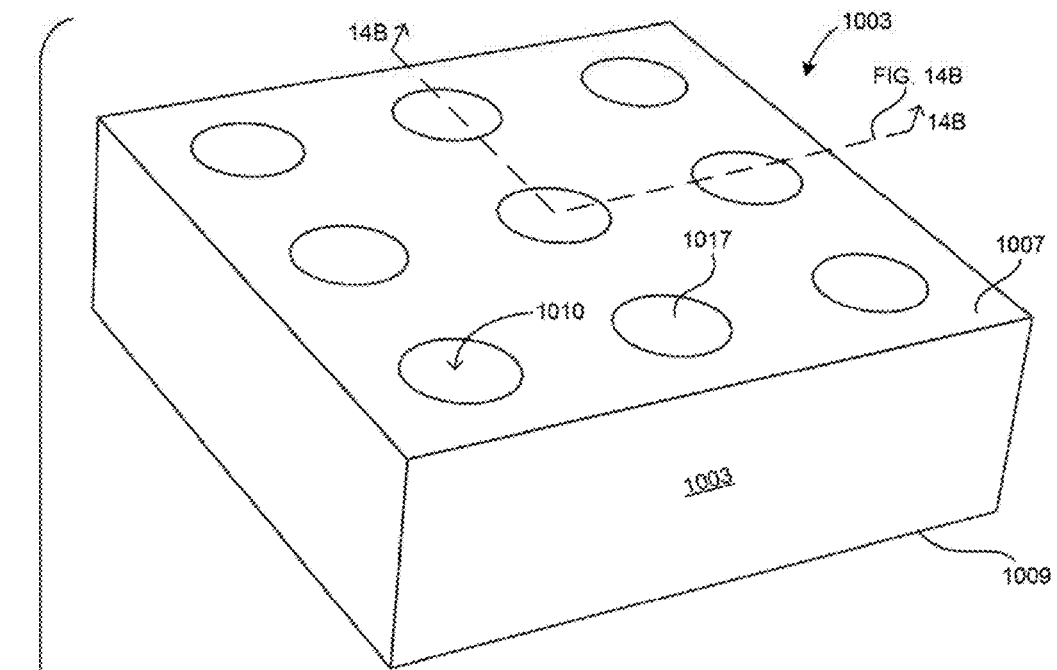
FIGS. 14, 14A, 14B, 14C, 14D, 14E, 14F, 14G, 14H, 14I, 14J, 14K, 14L, 14M, and 14N illustrate a method of making an interconnection element in accordance with one embodiment of the invention.
Figure 14A:
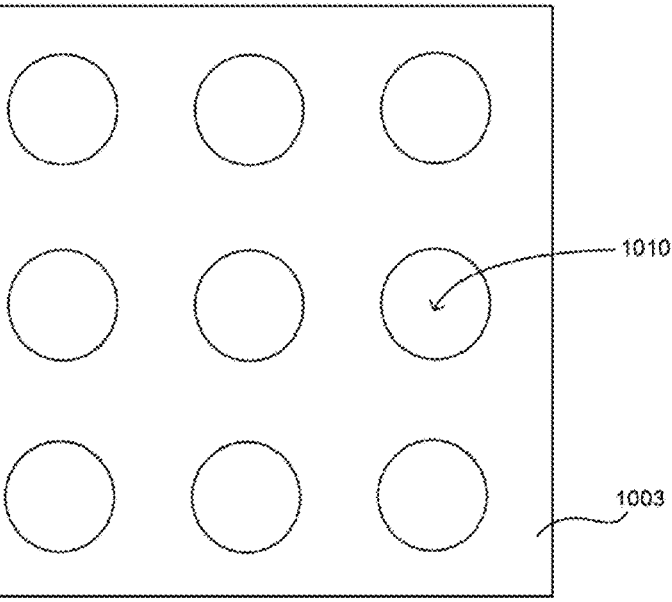
Figure 14B:
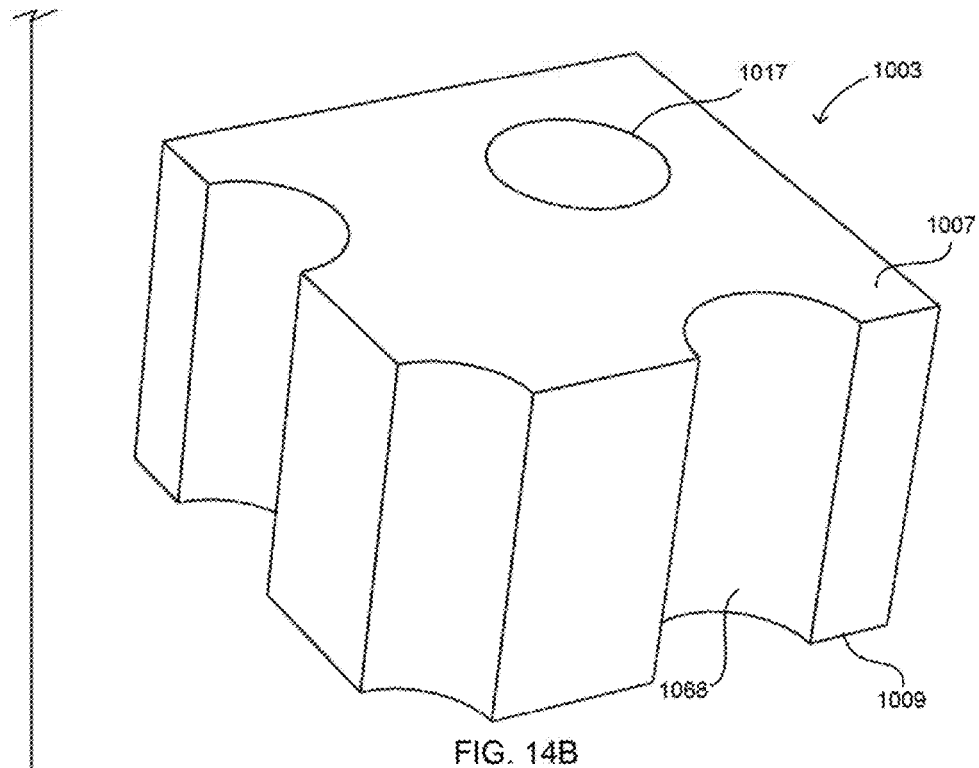
Figure 14C:
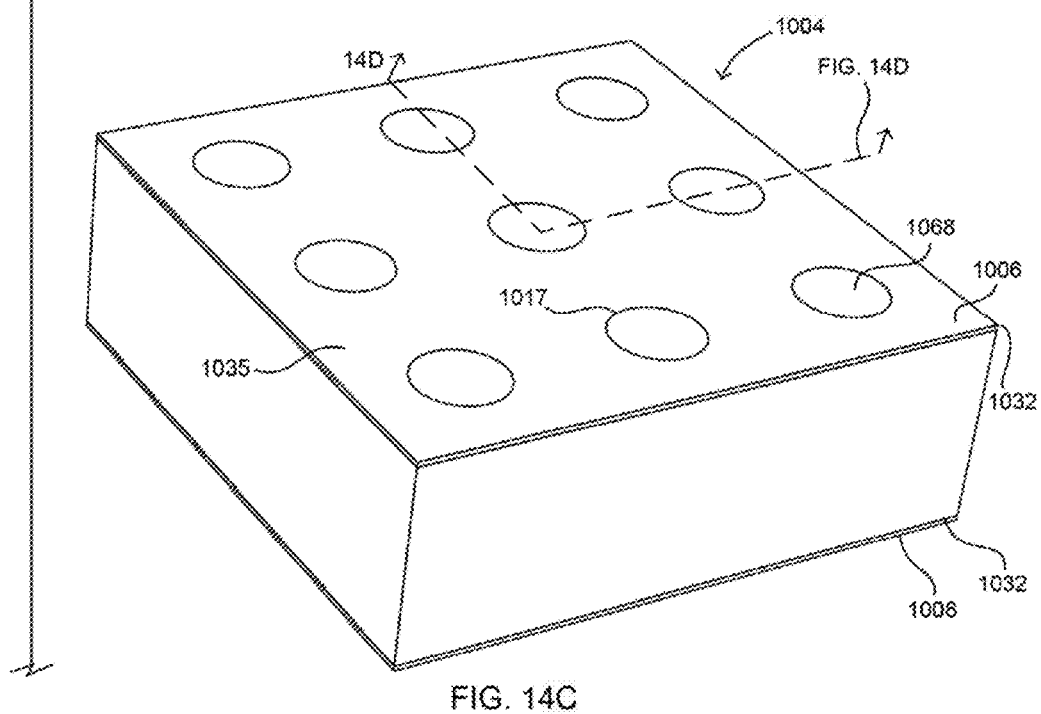
Figure 14D:
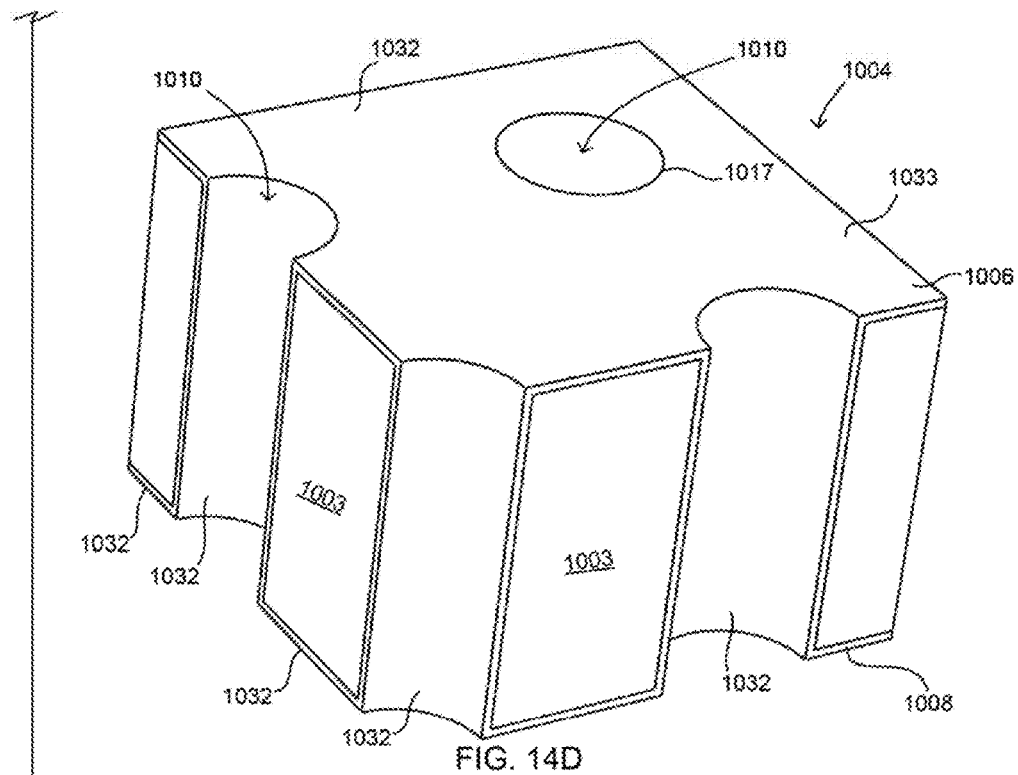
Figure 14E:
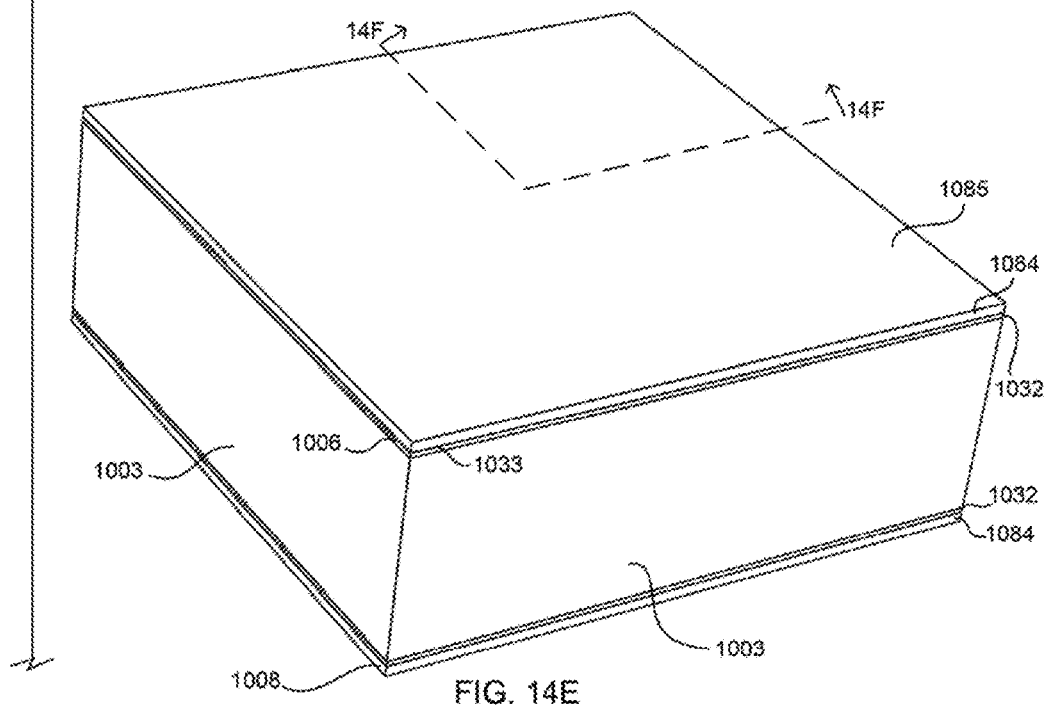
Figure 14F:
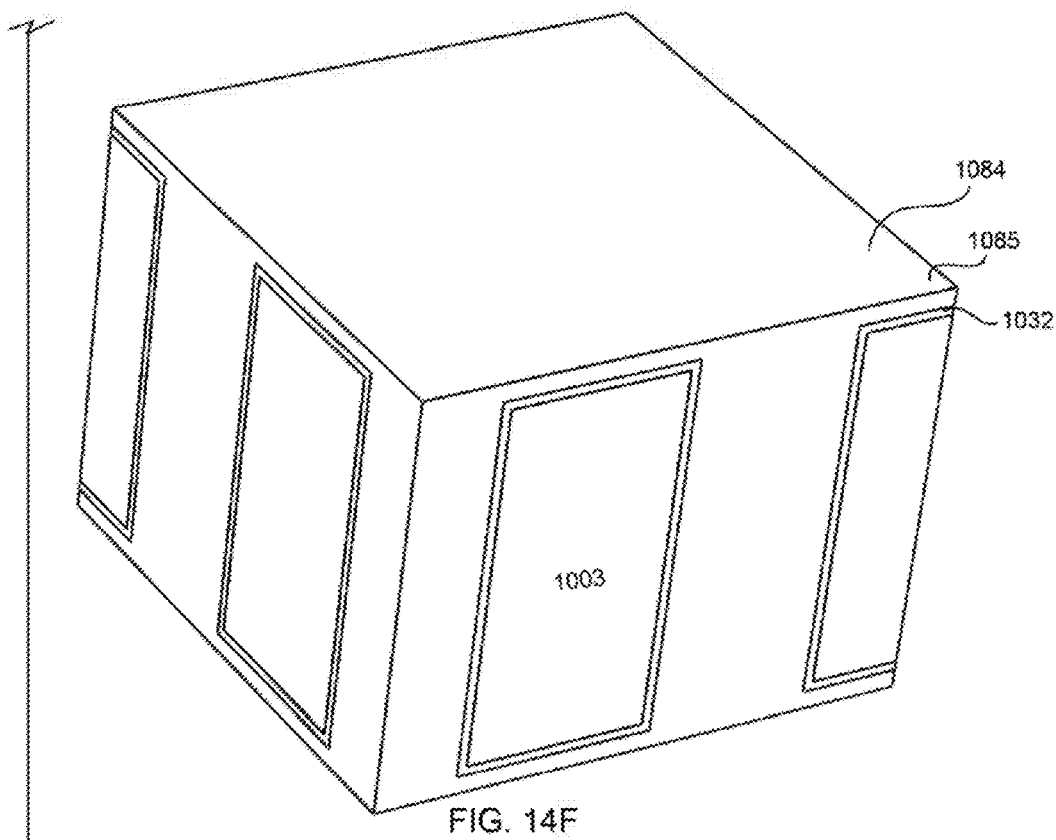
Figure 14G:
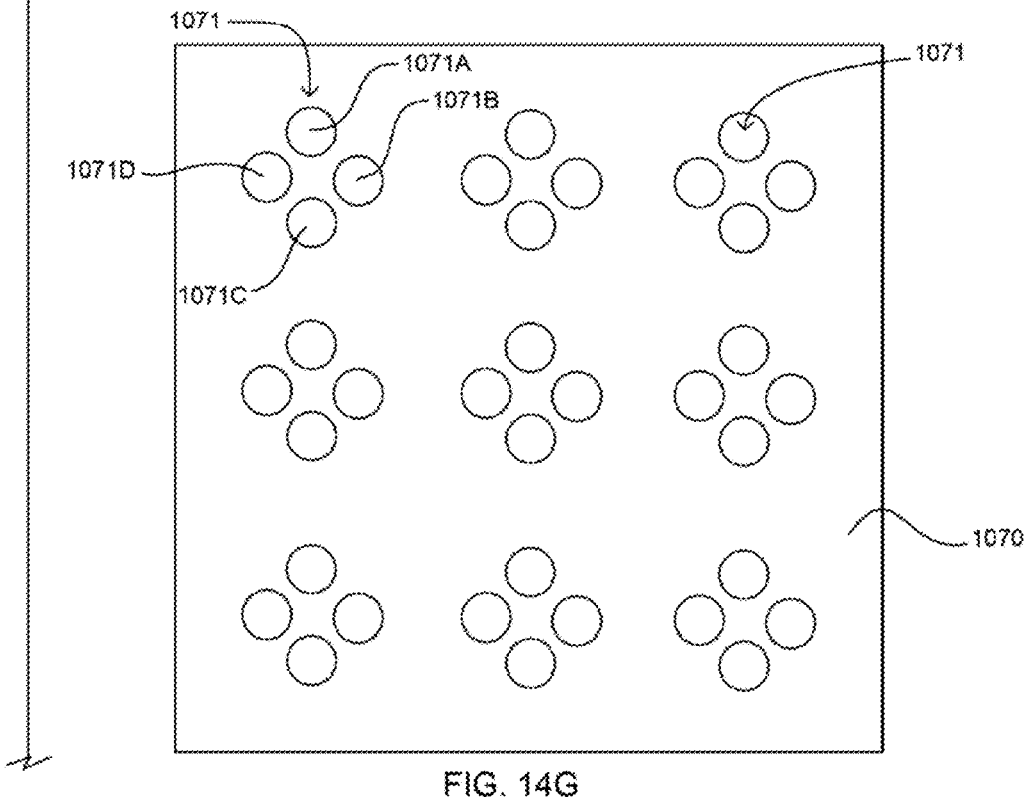
Figure 14H:
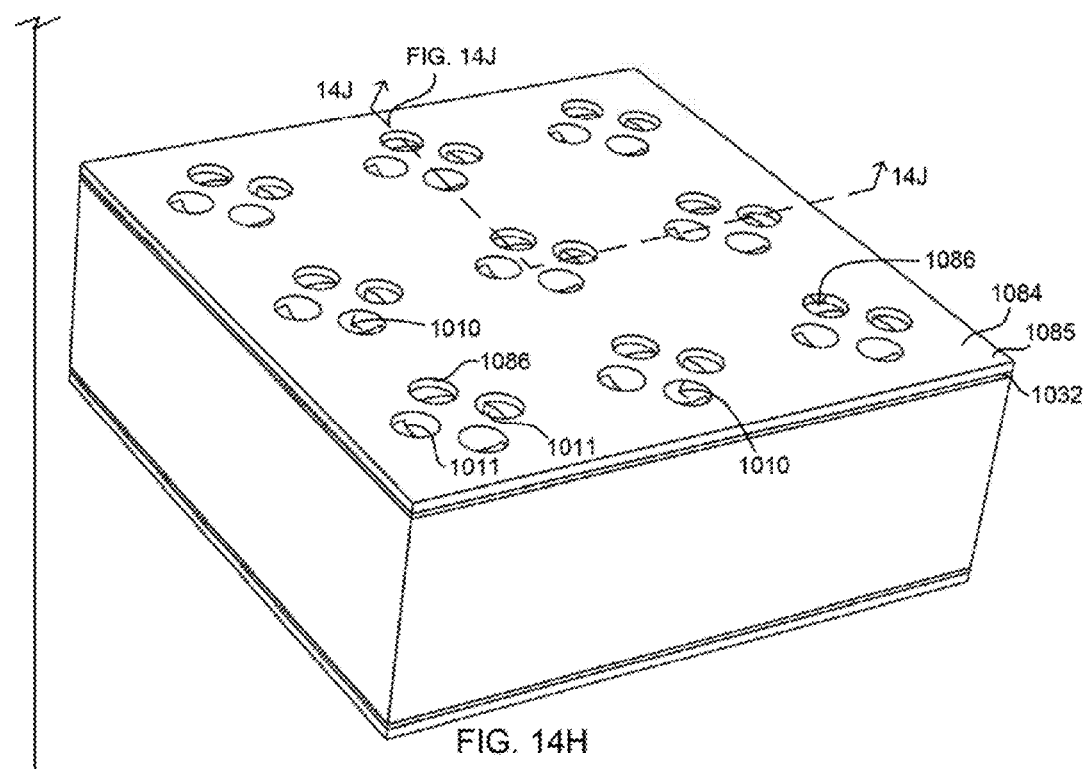
Figure 14I:
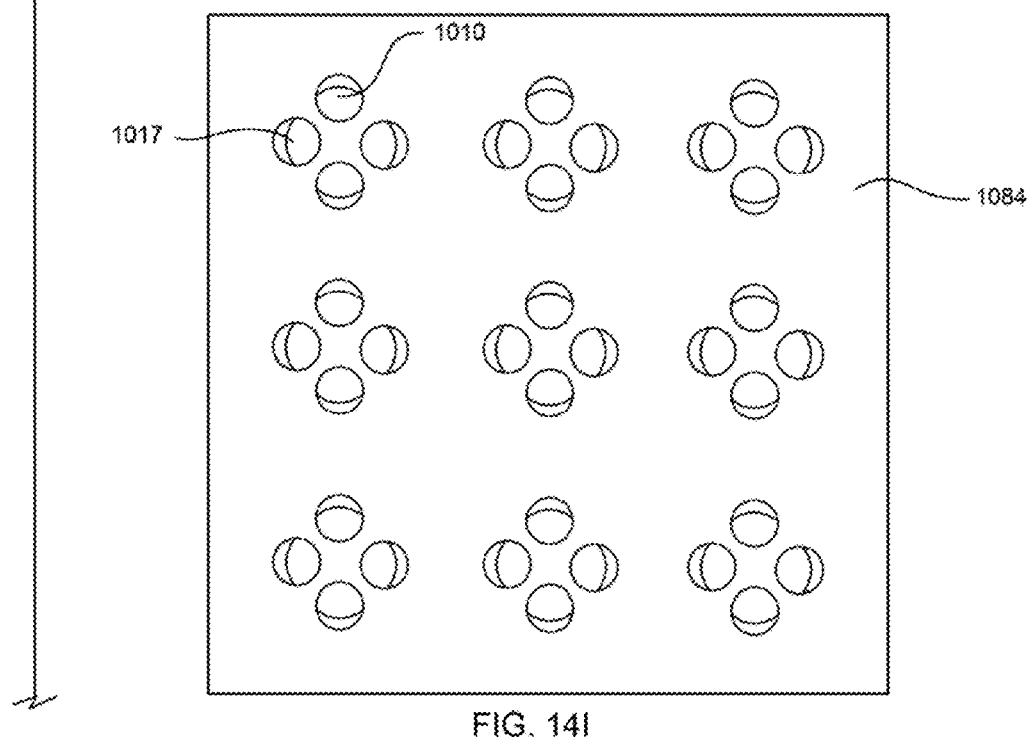
Figure 14J:
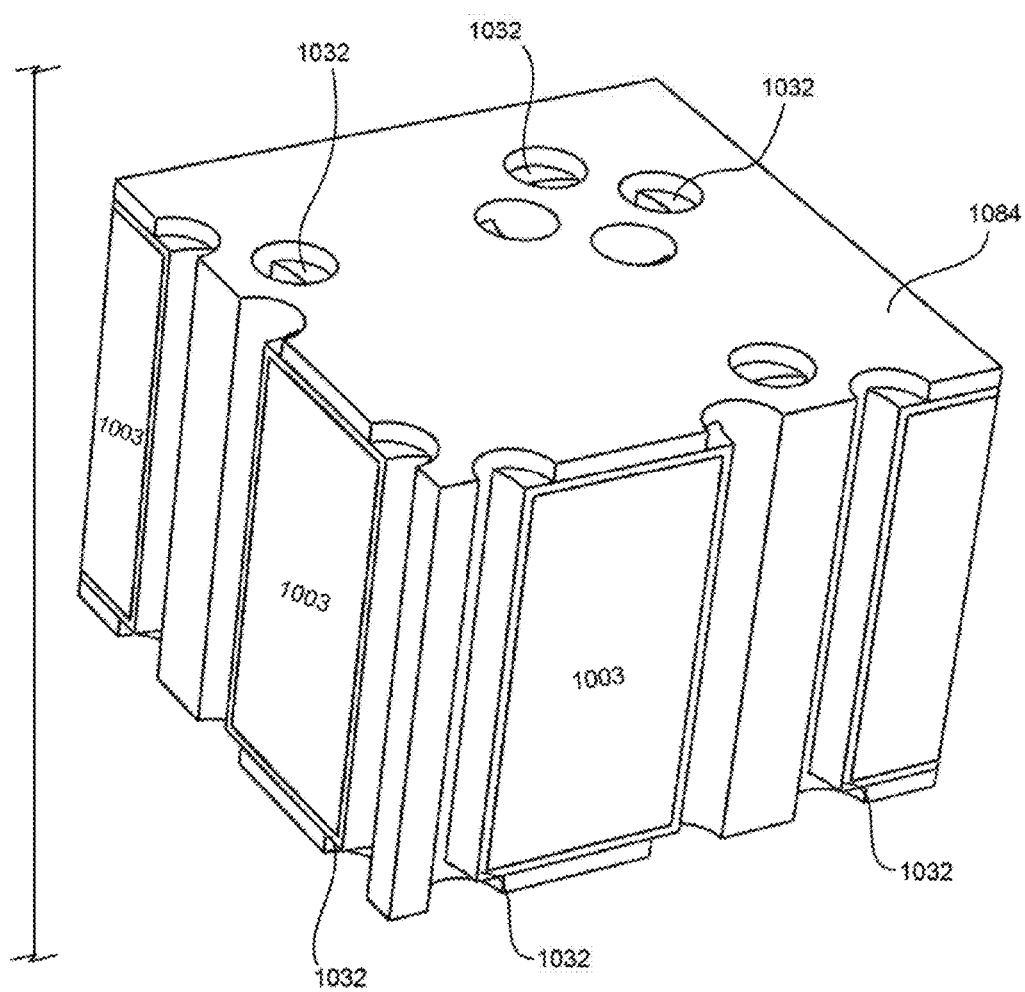
Figure 14K:
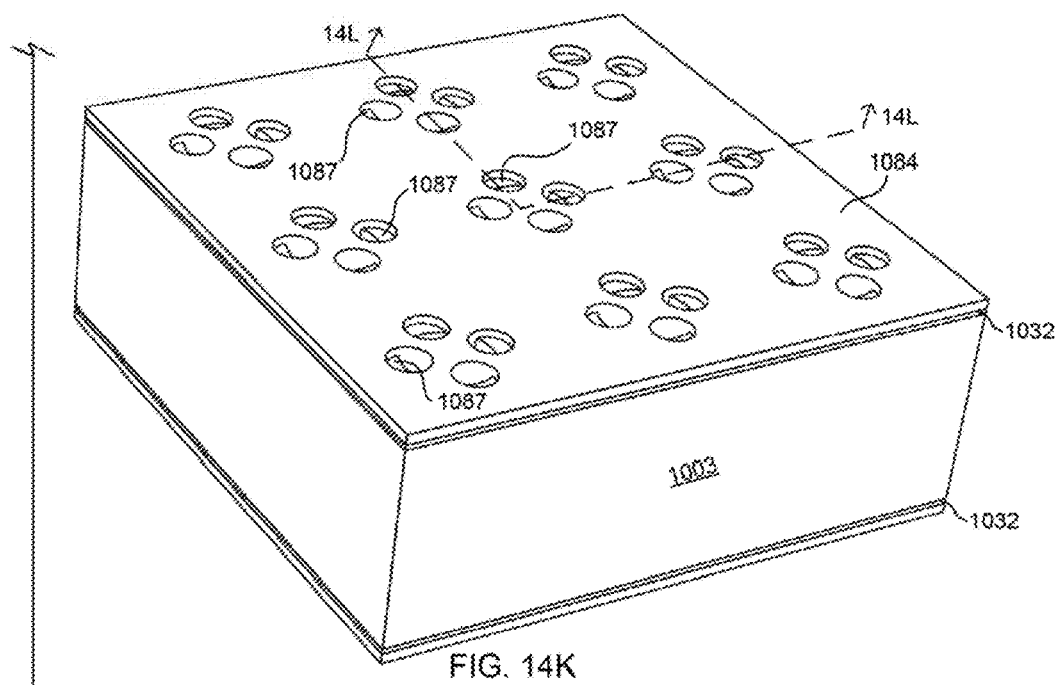
Figure 14L:
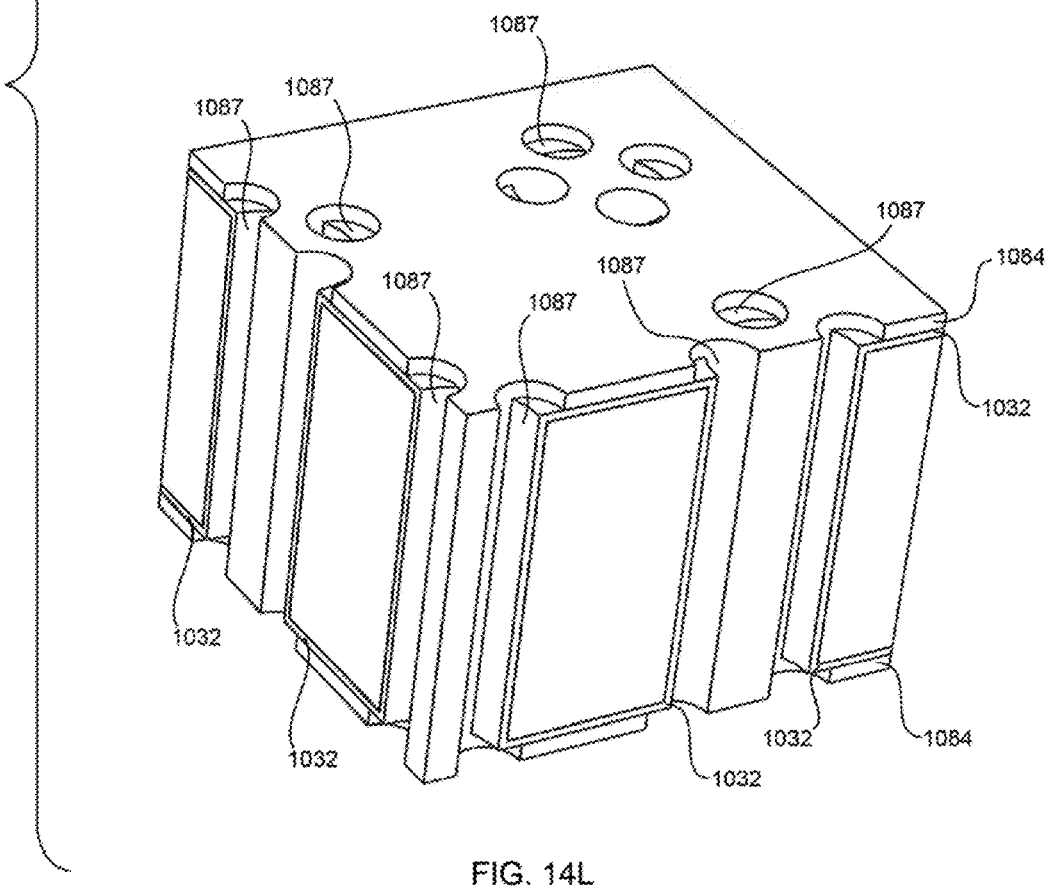
Figure 14M:
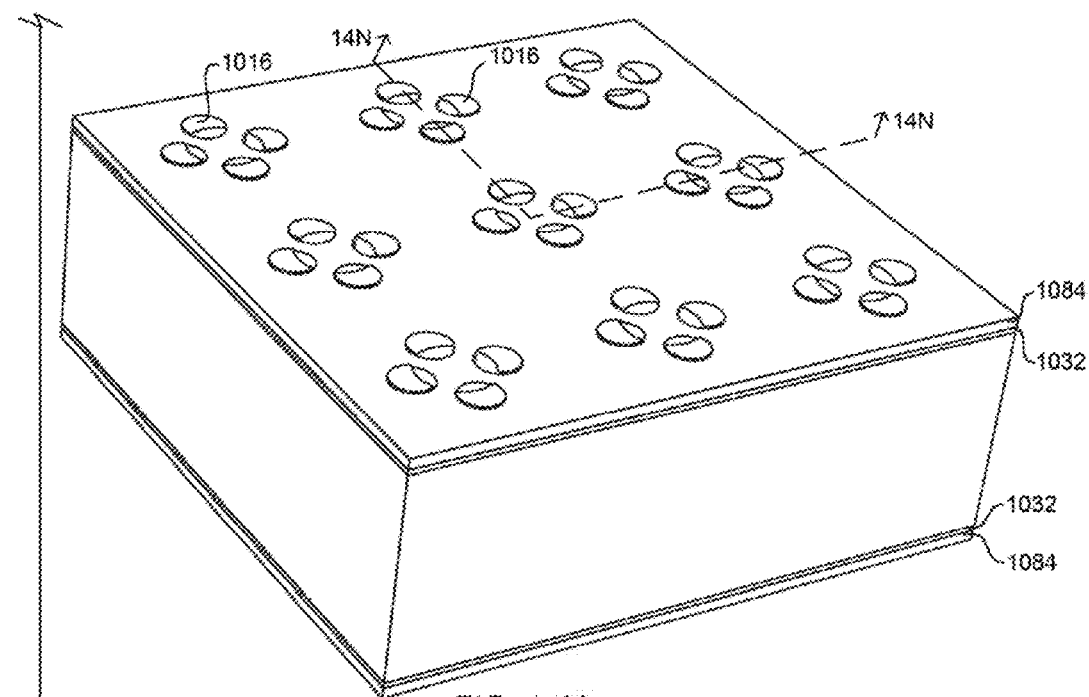
Figure 14N:
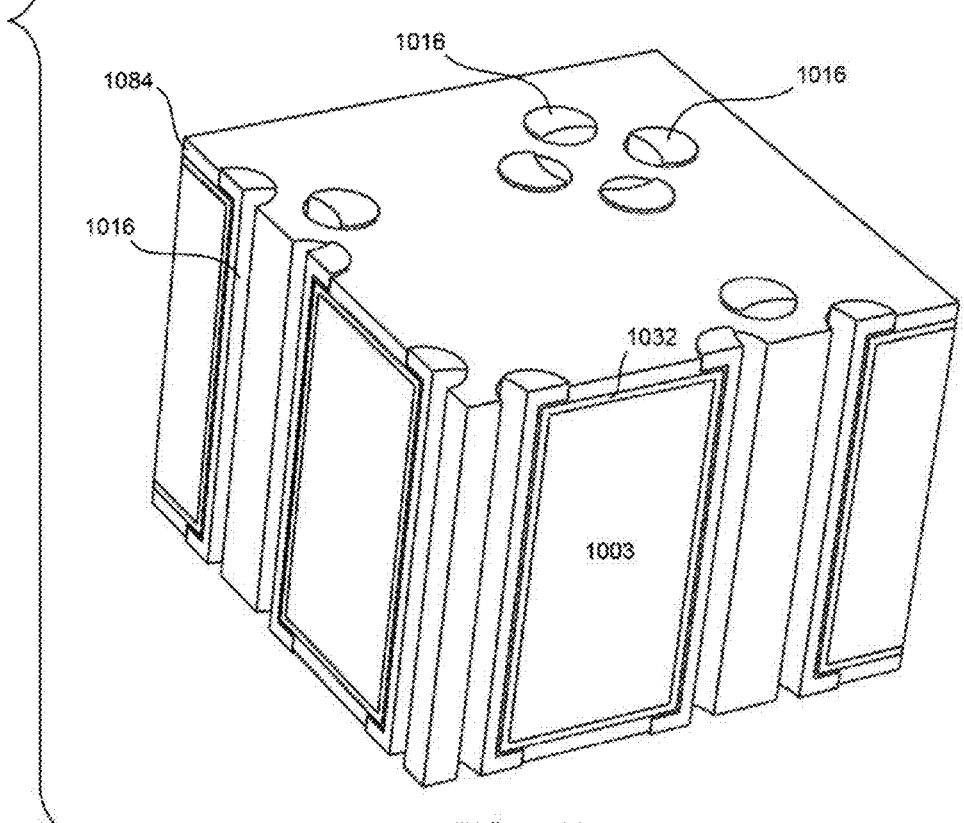

With reference to FIGS. 14-14N, a method of manufacturing the interconnection component 1000 shown in FIG. 12A is described. Turning first to FIGS. 14-14B, respectively a perspective view, top plan view, and cross-sectional view of substrate base 1003 taken along line 14B-14B in FIG. 14, substrate base 1003 is provided with openings 1010 that have a circular cross-section and that extend between the first surface 1007 and second surface 1009 of the substrate base 1003. Each opening 1010 has an interior surface 1068 (FIG. 14C) and outer circumferential edges 1017 at the first surface 1007 and second surface 1009 of the substrate base 1003.

Turning to FIGS. 14C-14D (a cross-sectional view taken along line 14D-14D of FIG. 14C), a dielectric layer 1032 may be provided on the exposed surfaces of substrate base 1003 to form substrate 1004. In a particular example, dielectric layer 1032 is provided on first surface 1007 and second surface 1009 of the substrate base 1003. Additionally, as best seen in FIG. 14D, dielectric layer 1032 may be provided within each of the interior surfaces 1068 of openings 1010 in the substrate. Dielectric layer 1032 also has an exposed outer surface 1035 at this stage of the process. It is to be understood that providing a dielectric layer 1032 is an optional step. The decision to provide or not to provide a dielectric layer 1032 will largely depend upon the material selected for the substrate base 1003. In one example, a dielectric layer 1032 will be unnecessary if the underlying substrate base 1003 is comprised of a non-conductive material such as glass.

With reference to FIG. 14E and FIG. 14F (a cross-sectional view taken along line 14F-14f of FIG. 14E), a resist layer 1084 may be provided over the outer surface 1033 (FIG. 14D) of dielectric layer 1032. Resist layer 1084 will overlie first and second surfaces 1006,1008 of the substrate 1004, which also directly overlie the outer surface 1033 of dielectric layer 1032. As best seen in FIG. 14F, resist material will also fill (either fully or partially) openings 1010.

Turning to FIG. 14G, a top plan view, a mask 1070 or stencil having a plurality of openings 1071 is obtained. In an exemplary embodiment, mask 1070 has a plurality of groups of openings 1071. Each group may include four circular openings 1071A-D that together form the shape of a diamond. It is to be appreciated that each of the openings 1071A-D can have alternative shapes, such as triangular, that can be based on a particular design. Additionally, each opening 1071A-D can be the same shape or one or more of the openings 1071A-D can differ. Furthermore, each group 1071 of openings may consist of only one opening, or more than one opening.

The mask 1070 may be temporarily placed onto the exposed surfaces 1085 of resist layer 1084 (see FIG. 14F) so that the openings 1071 in the mask 1070 will overlap the underlying openings 1010 that have been covered by resist layer 1084 and/or filled with resist material from the resist layer 1084. Turning to FIG. 14H, openings 1086 can be created in the resist layer 1084, as well as through the resist layer 1084 by using the mask and mask openings 1071 as a template. In this embodiment, portions of the resist material overlying the dielectric layer 1032 can be removed using etching, particle blasting, or known methods of removal. Additionally, using the same or similar methods, resist material that both fills the openings 1010 and is exposed through the opening 1086 created in the resist layer can be removed.

In one embodiment, as best seen in FIG. 14H, FIG. 14I, and FIG. 14J (a cross-sectional view taken along line 14J-14J of FIG. 14H), once openings 1086 are provided in the resist layer 1084 and the resist material is removed from within the openings 1010, the circumferential edge 1017 of the opening 1010 coated with dielectric layer 1032 and portions of the dielectric layer 1032 within the opening 1010 are now visible through the openings 1086. In an exemplary embodiment, the resist layer is made from a material significantly softer than the dielectric material comprising the dielectric layer 1032 so as to aid in the resist material removal process.

Turning to FIG. 14K and FIG. 14L (a cross-sectional view taken along line 14L-14L of FIG. 14K), a barrier or seed layer 1087 may be coated onto the portions of dielectric layer 1032 that are now exposed within each of the openings 1010. A metal may then be plated onto the barrier/seed layer 1087 to form conductors 1016, as shown in FIGS. 14M-N. Thereafter, any remaining resist material from resist layer 1084 may be removed, resulting in the interconnection component of FIG. 12A.

Figure 15:
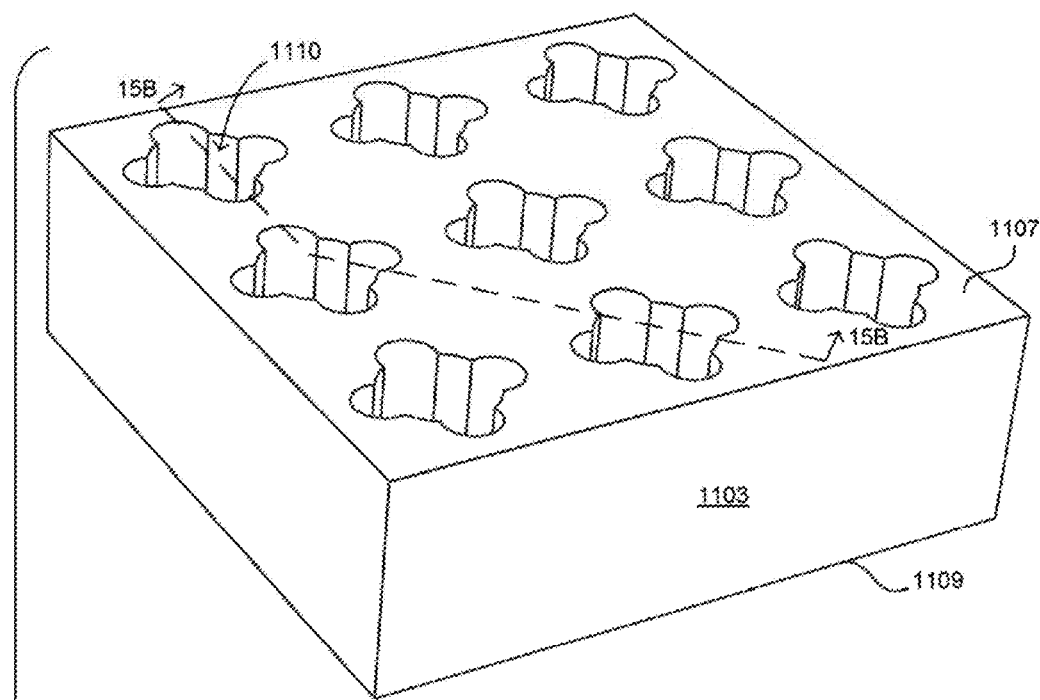
Figure 15A:
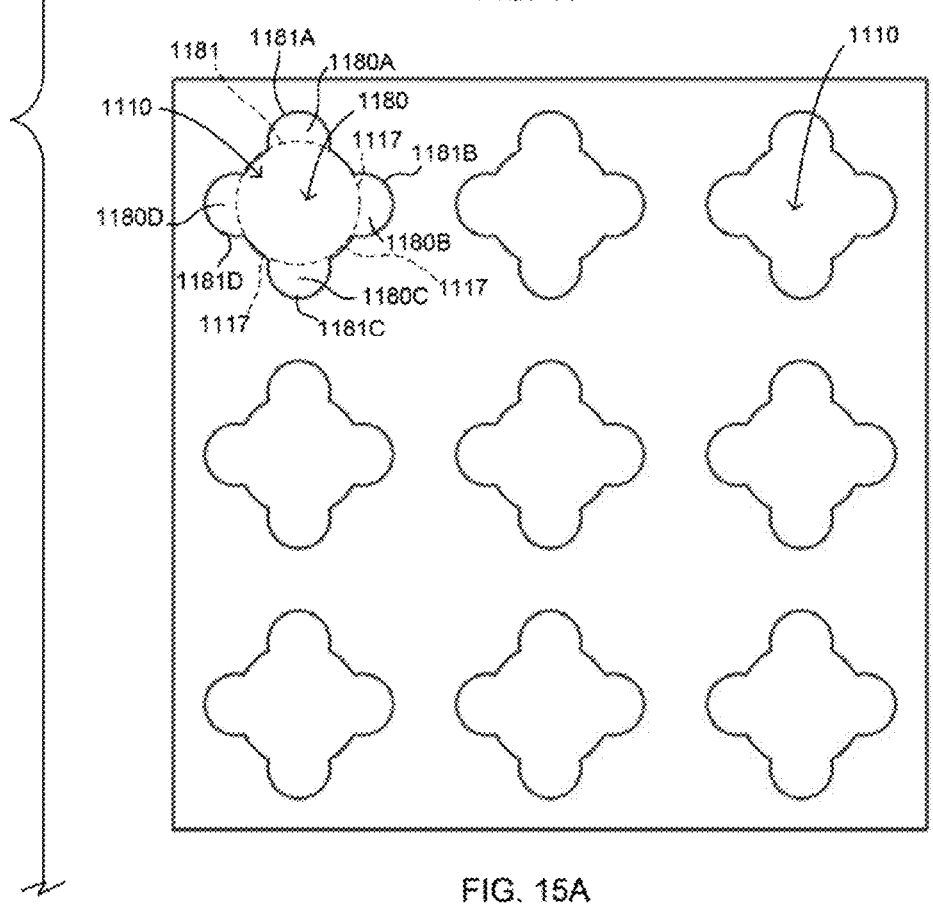
Figure 15B:
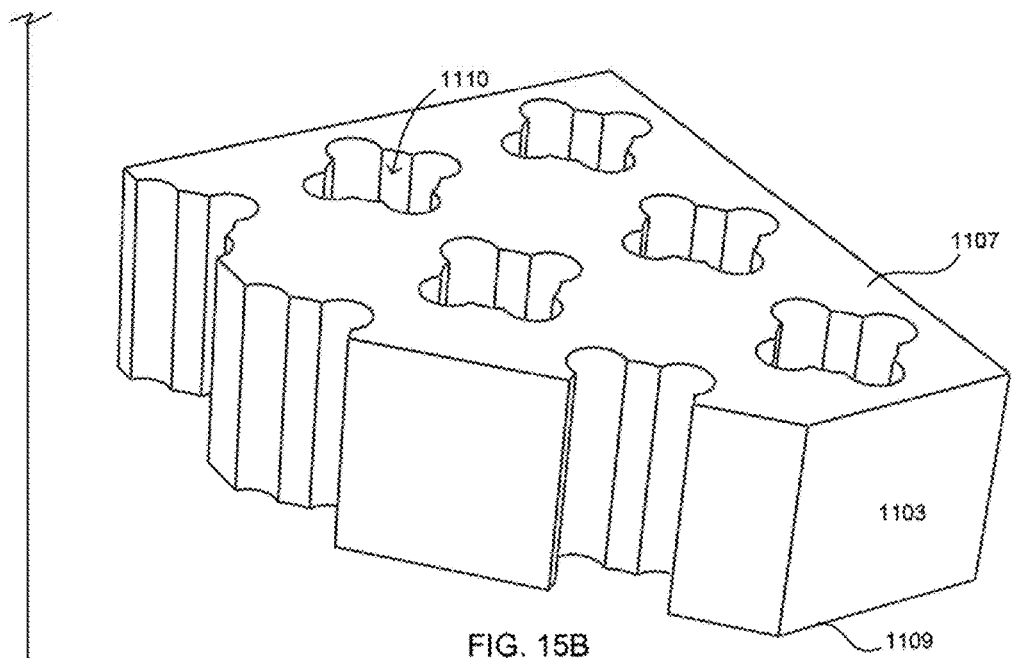
Figure 15C:
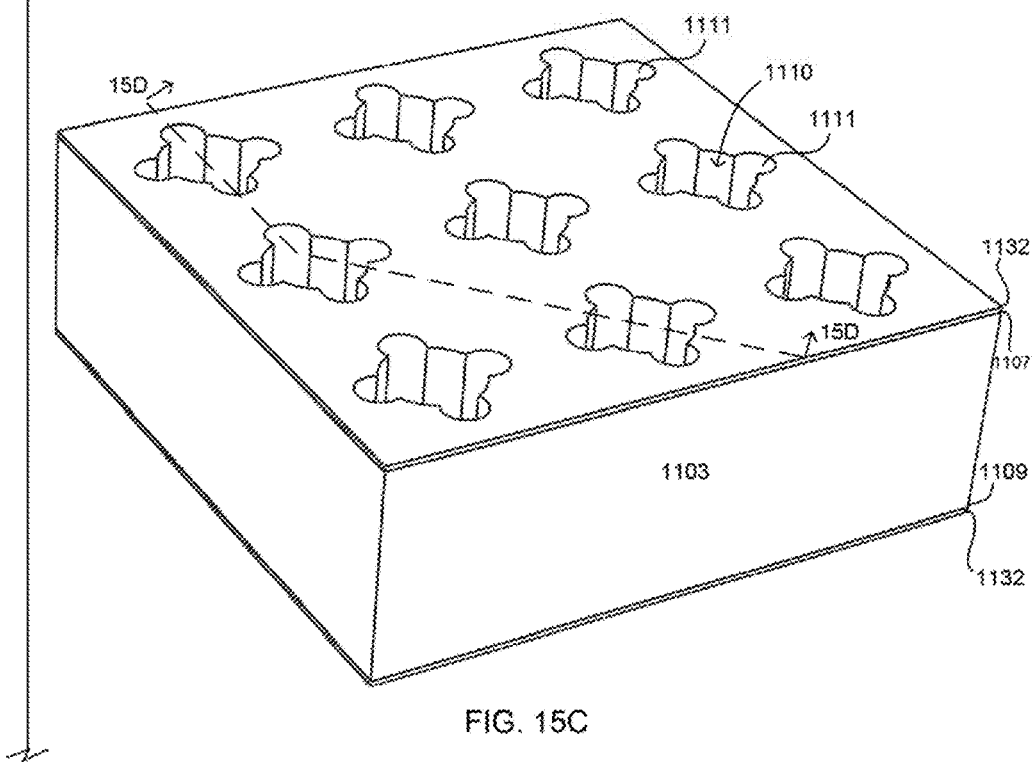
Figures 15D, 15E:
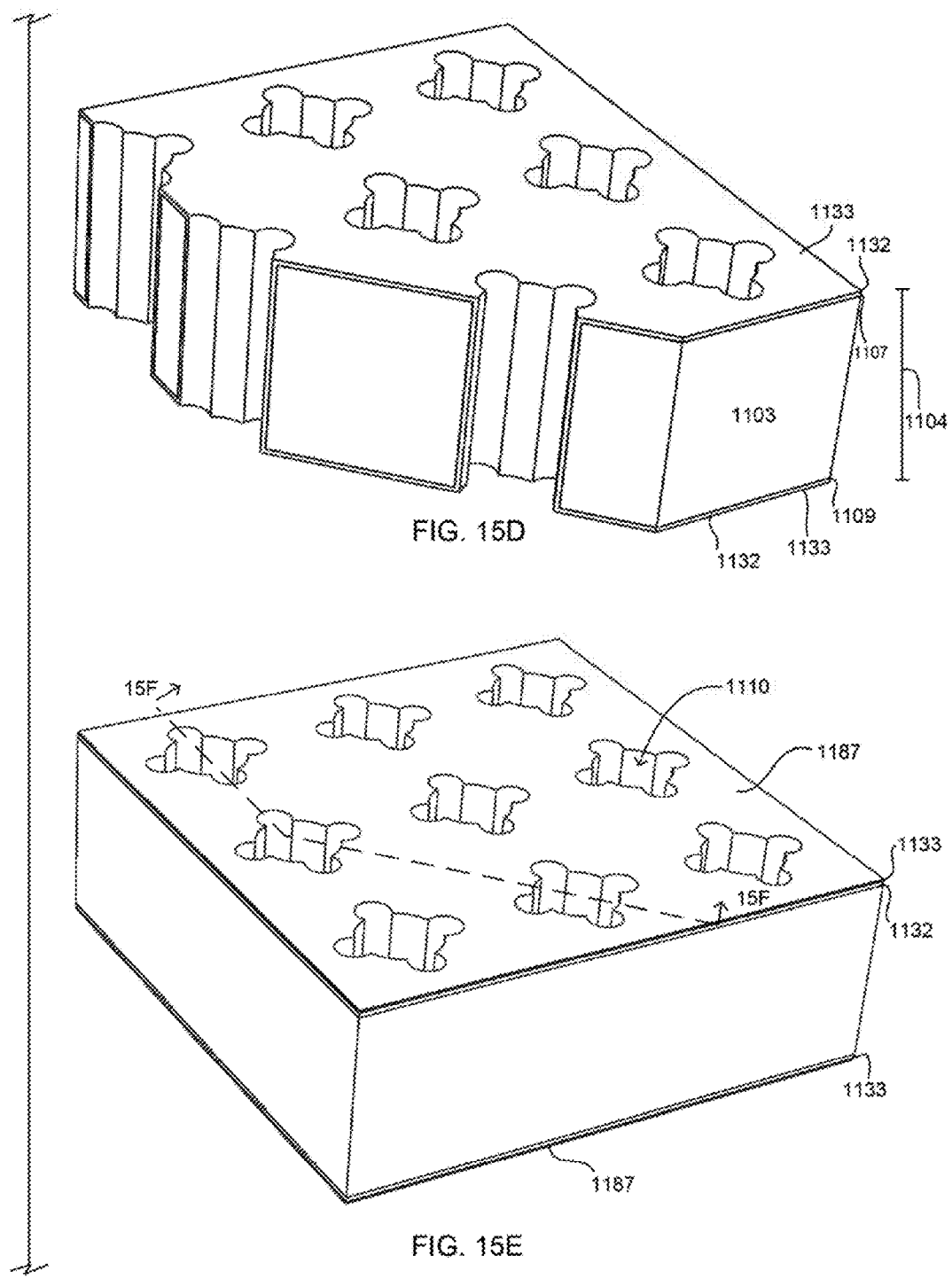
Figure 15F:
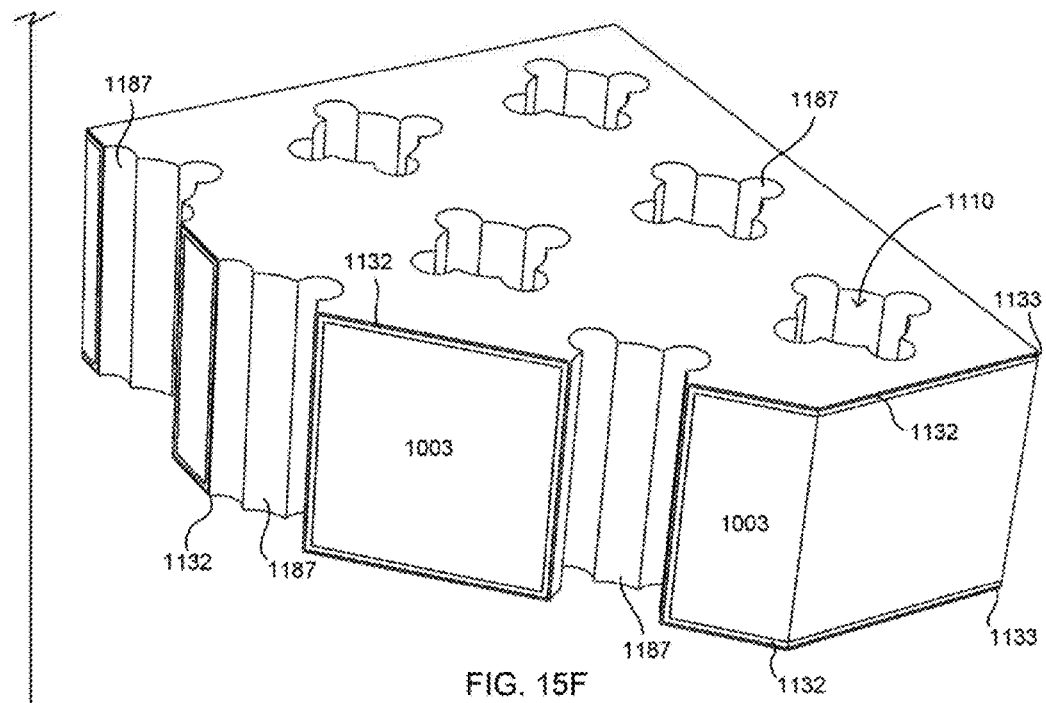
Figure 15G:
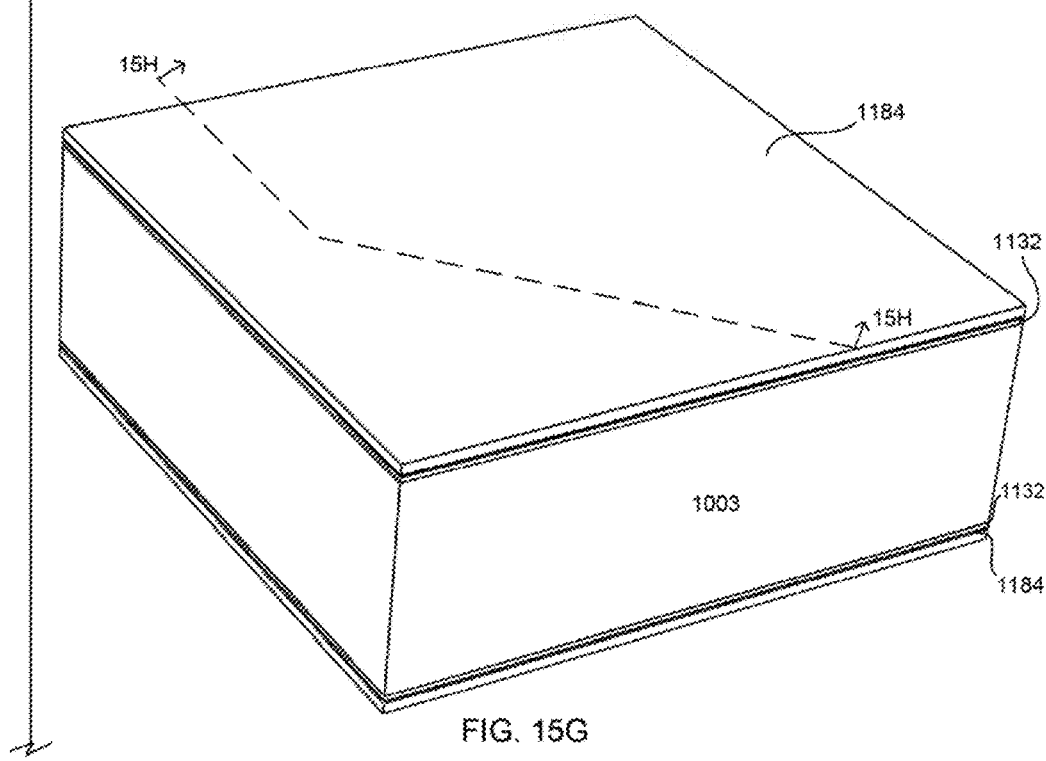
Figure 15J:
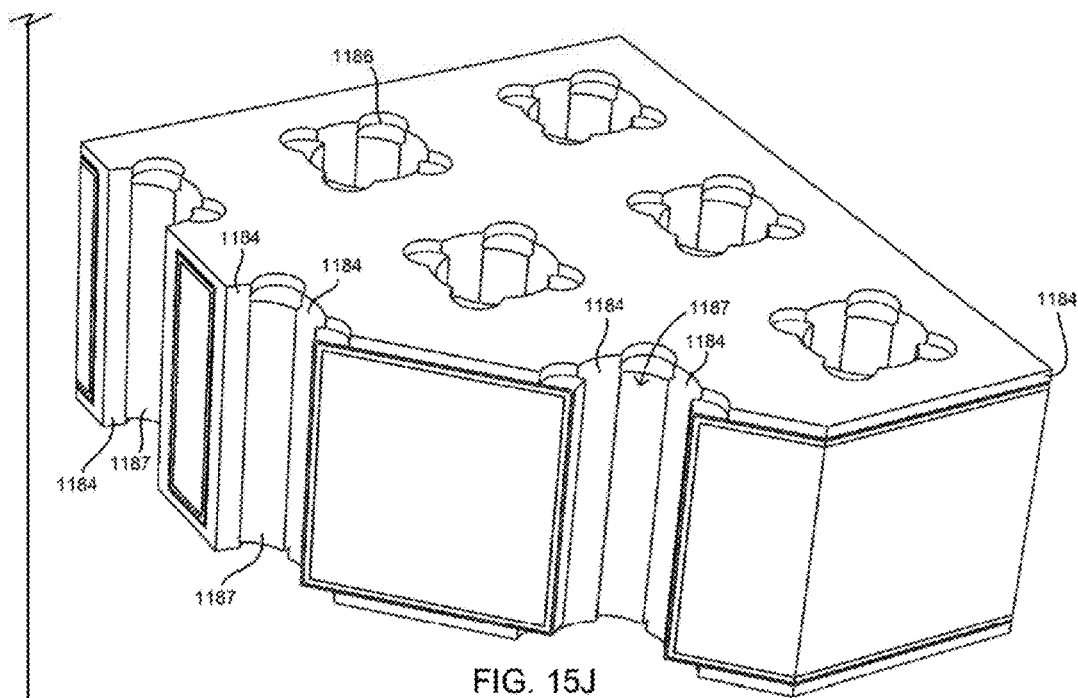
Figure 15K:
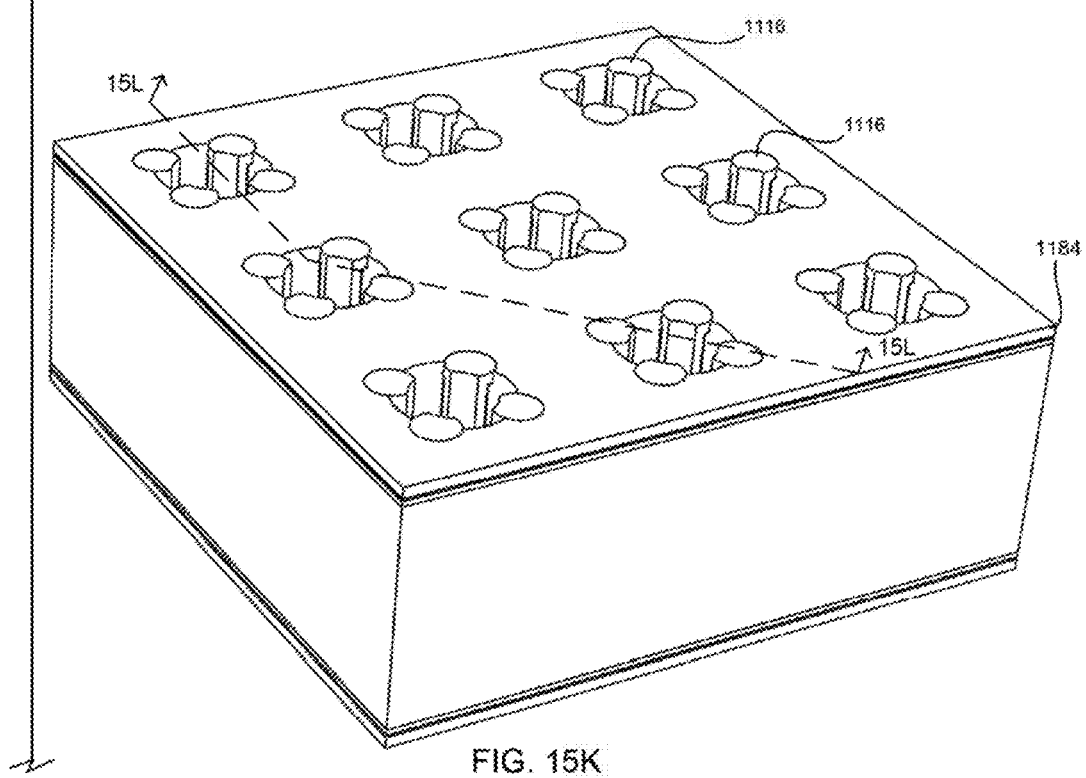
Figure 15L:
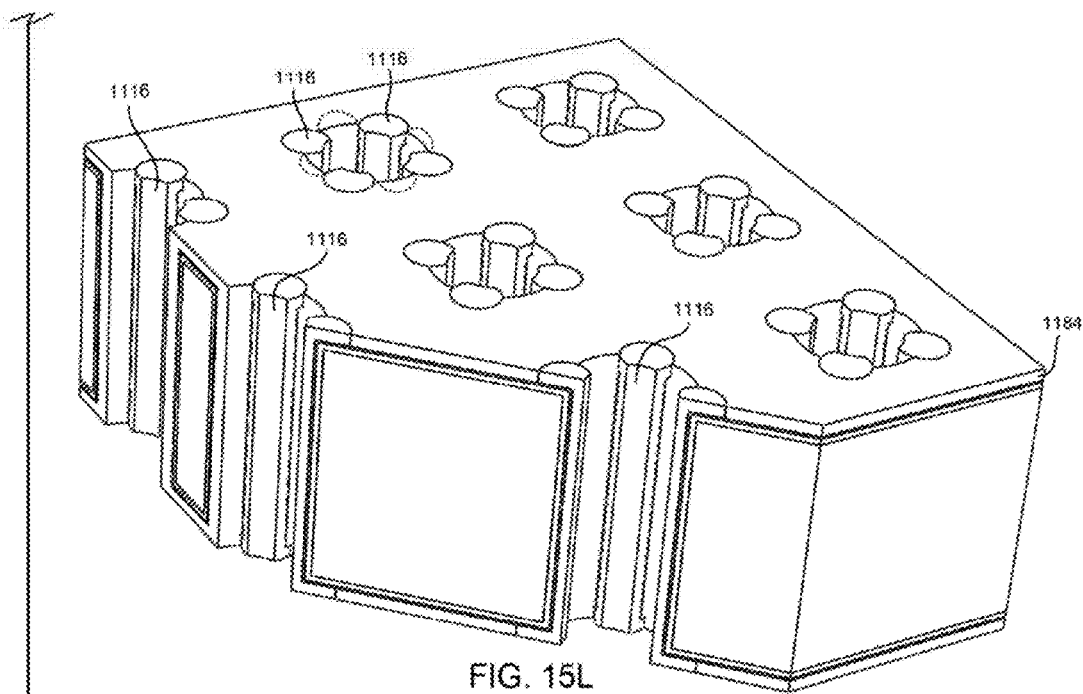
Figure 15M:
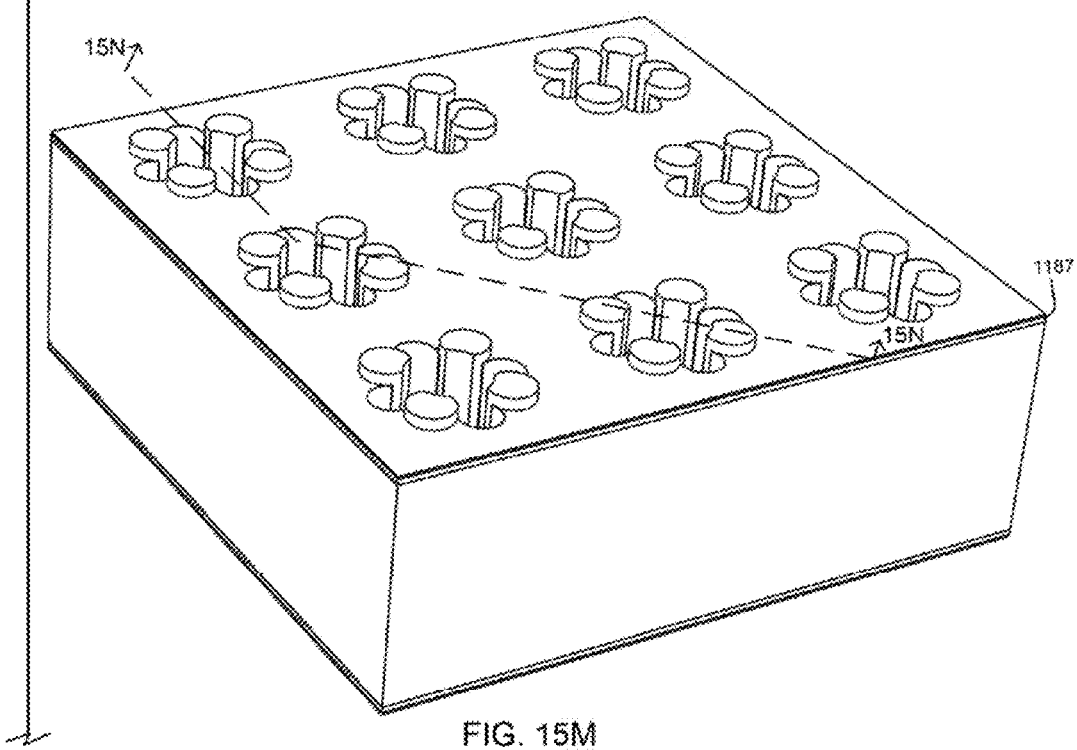
Figure 15N:
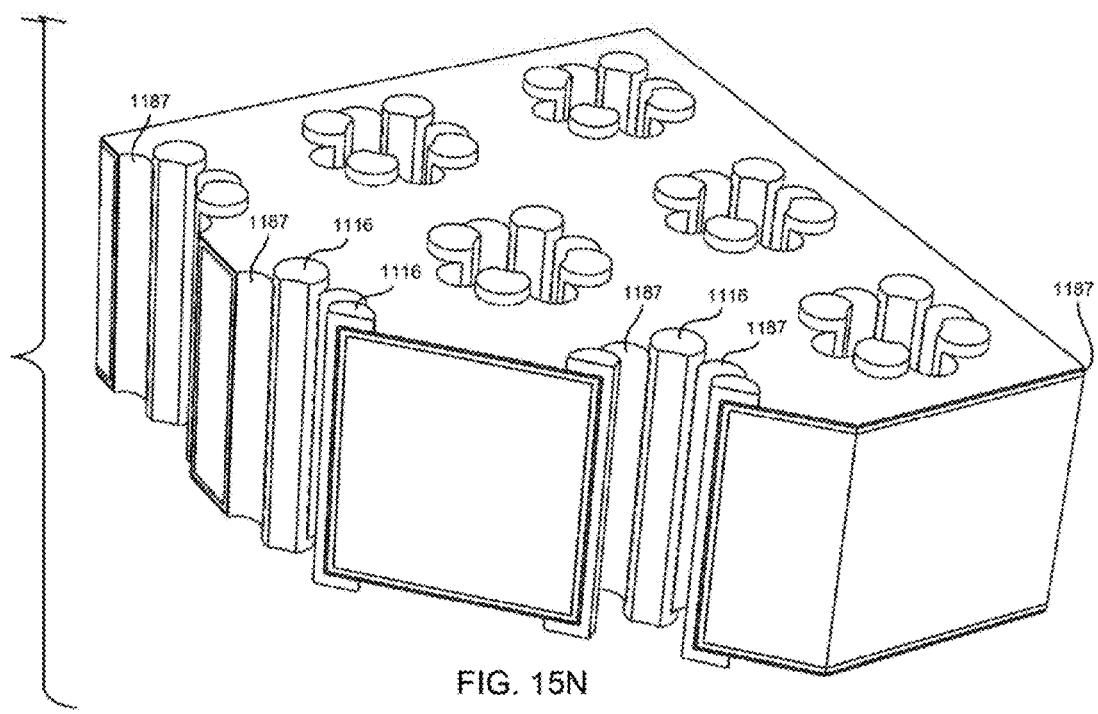

Turning now to FIG. 15-15N, a method of making the interconnection component 1100 of FIG. 13 in accordance with one embodiment is shown. Referring first to FIG. 15, FIGS. 15A, and 15B (a cross-sectional view taken along line 15B-15B of FIG. 15), a substrate base 1103 includes a plurality of openings 1110. The openings 1110 may be made from a series of central openings 1180 overlapped by one or more other openings. In the exemplary embodiment shown in FIG. 15A, the cross-section of the opening 1110 includes a central opening 1180 having a circular cross-sectional circumferential edge 1117 and a series of four overlapping openings 1180A, 1180B, 1180C, and 1180D that each have circular cross-sections. The overlapping openings 1180A-D extend around the circumferential edge 1117 of the central opening 1180. Each of the four circular overlapping openings 1180A-D have respective outer edges 1181A-D that extend around the circumferential edge 1181 of the central opening 1180. As shown, only those portions of circumferential edge 1117 of the central opening 1180 that are not overlapped by the overlapping openings 1180A-D remain visible. It is to be appreciated that although circular openings are provided around the circumferential edge 1117 of the central circular opening 1180, additional shapes such as a rounded square, a circle with more than one small overlapping circle (as shown), triangular, or any other desired shape may be provided. The shape of the central opening 1180 may also differ.

As previously discussed, depending upon the material selected for the substrate base 1103, the substrate 1104 may include a coating of dielectric layer 1132, as shown in FIG. 15C and FIG. 15D (a cross-sectional view taken along line 15D-14D of FIG. 15C). In this embodiment, dielectric layer 1132 is provided over the exposed first and second surfaces 1107,1109 of the substrate base 1103, as well as within the openings 1110 extending between the first and second surfaces 1107,1109.

Turning to FIG. 15E and FIG. 15F (a cross-sectional view taken along line 15F-15F of FIG. 15E), a seed layer 1187 may be provided over the outer surface 1135 (FIG. 15D) of the dielectric layer 1132 overlying the first and second surfaces 1107,1109 of the substrate base 1103, as well as the dielectric layer 1132 lining the openings 1110. With reference to FIG. 15G and FIG. 15H (a cross-sectional view taken along line 15H-15H of FIG. 15G), a resist layer 1184 may be provided over the seed layer 1187 that overlies the first and second surfaces 1107,1109 of the substrate base 1103, as well as within the openings 1110 lined by seed layers 1187. In this embodiment, the resist layer 1184 substantially fills all of the openings 1110 with resist material, such that the openings 1110 are filled with resist material. Referring to FIG. 15I and FIG. 15J (a cross-sectional view taken along line 15J-15J of FIG. 15I), using a template or the like, the resist layer 1184 overlying the first surface 1107 and second surface 1109 of the substrate base 1103 may be selectively etched or patterned to provide openings 1186 within the resist layer 1184 that overlie portions of the seed layer 1187. The opening 1186 created in the resist layer 1184 may be shaped similarly to the original shape of the opening 1110 created in the substrate base 1103. The opening 1186 created in the resist layer 1184 overlaying, has a circular central resist opening 1180' that is aligned with the central opening 1180 extending through the substrate 1104. Four circular resist openings 1180A', 1180B', 1180C', 1180D' overlap and extend around the circumferential edge 1181 of the central resist opening 1180'. In this embodiment, the overlapping circular resist openings 1180A-1180D of the resist layer 1184 are not aligned with the overlapping openings 1180A-1180D in the substrate base 1103. The overlapping circular resist openings 1180A'-1180D' are instead positioned directly adjacent and between each of the overlapping openings 1180A-1180D in the substrate base 1103, as shown in broken line FIG. 15I. It is to be appreciated that second surfaces may be patterned identical to the first surface.

The resist material filling the central portion of the opening 1110 in the substrate 1104 can also be selectively etched so as to expose the seed layer overlying the circumferential edge 1117 of the opening extending through the substrate 1104.

Turning now to FIG. 15K and FIG. 15L (a cross-sectional view taken along line 15L-15L of FIG. 15K), a metal material, such as copper, copper alloys or the like may be plated up over the seed layer 1187, that is exposed through the openings 1186 in the resist layer 1184 to form conductors 1116. As shown in FIG. 15M and FIG. 15N (a cross-sectional view taken along line 15N-15N of FIG. 15M), all of the remaining resist layers 1184 can be removed, including any remaining resist material within the overlapping openings 1180A-1180D, to reveal the underlying seed layer 1187. Thereafter, the remaining portions of seed layer 1187 may be removed to reveal the interconnection component of FIG. 13.

Figure 16:
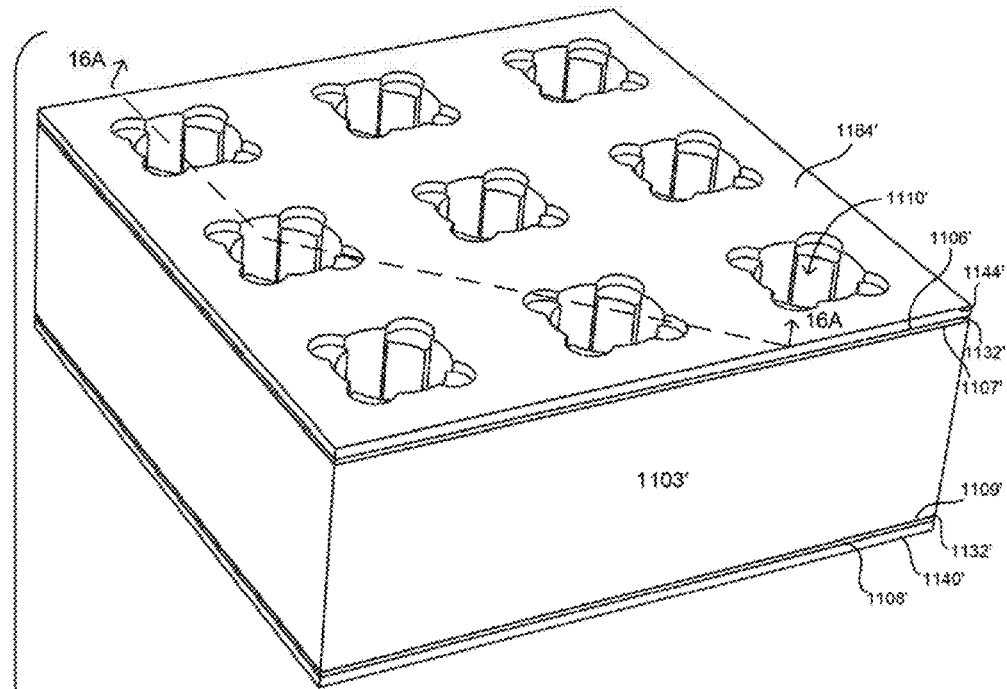
FIGS. 16, 16A, 16B, 16C, 16D, 16E, 16F, and 16G are various views illustrating a method of making an interconnection component in accordance with one embodiment of the invention.
Figure 16A:
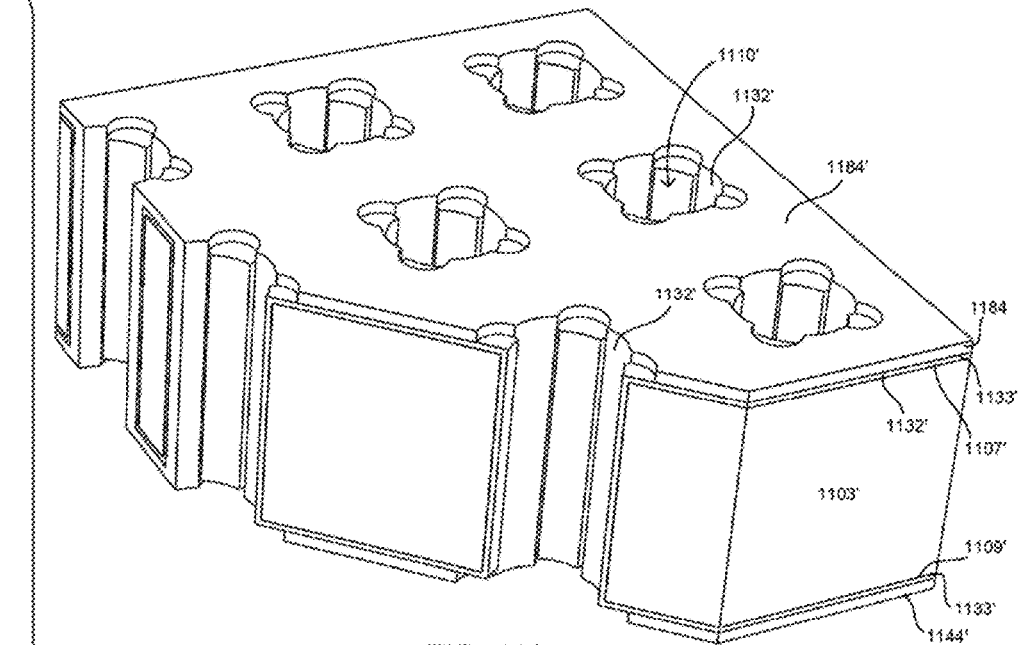
Figure 16B:
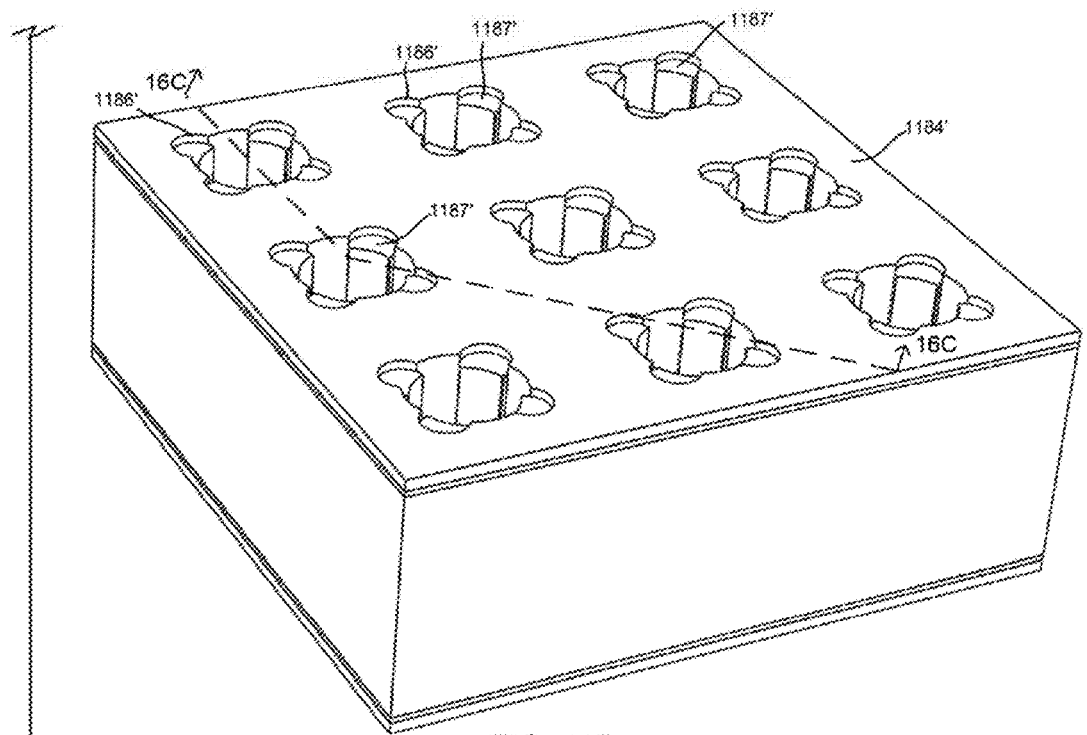
Figure 16C:
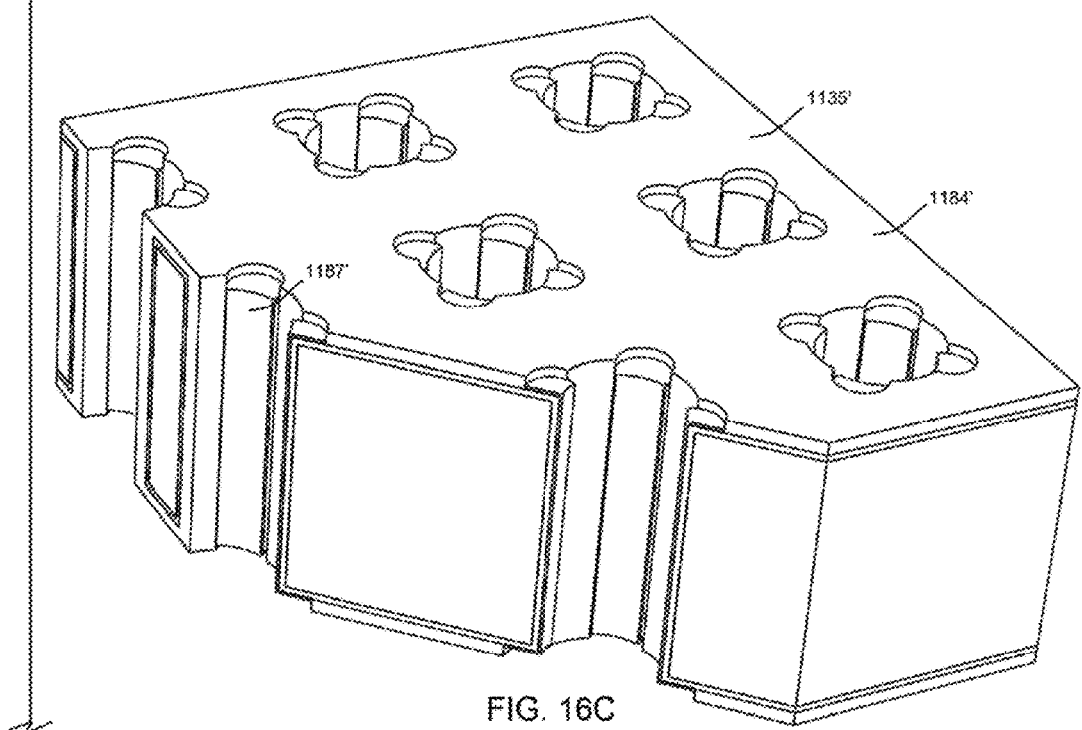
Figure 16D:
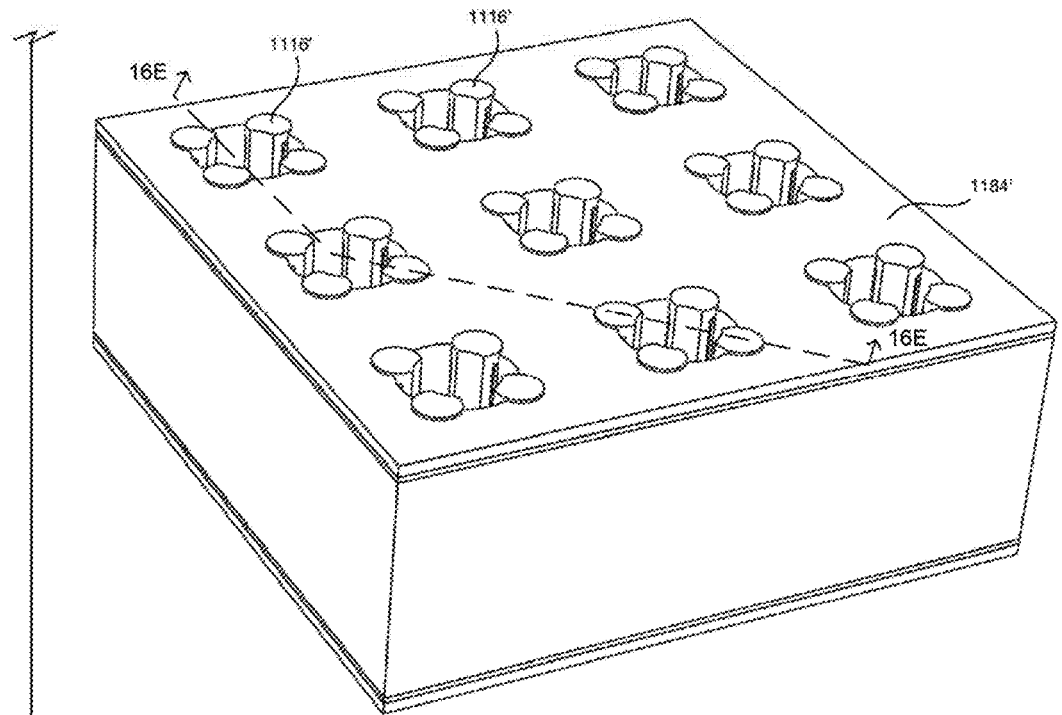
Figure 16E:
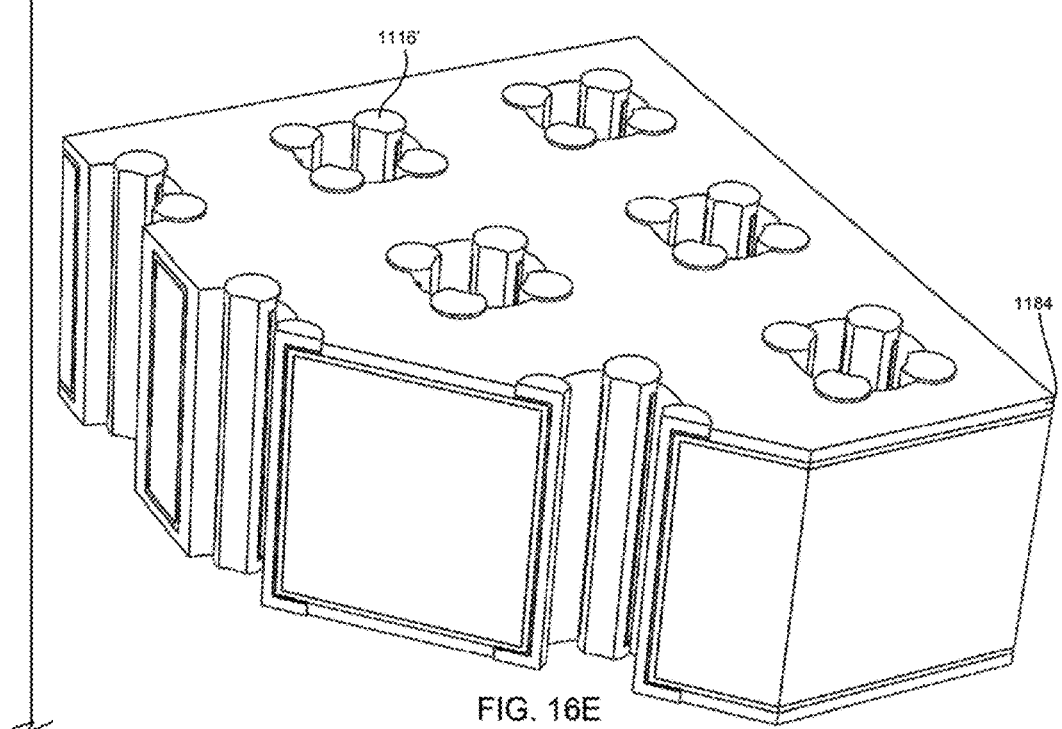
Figure 16F:
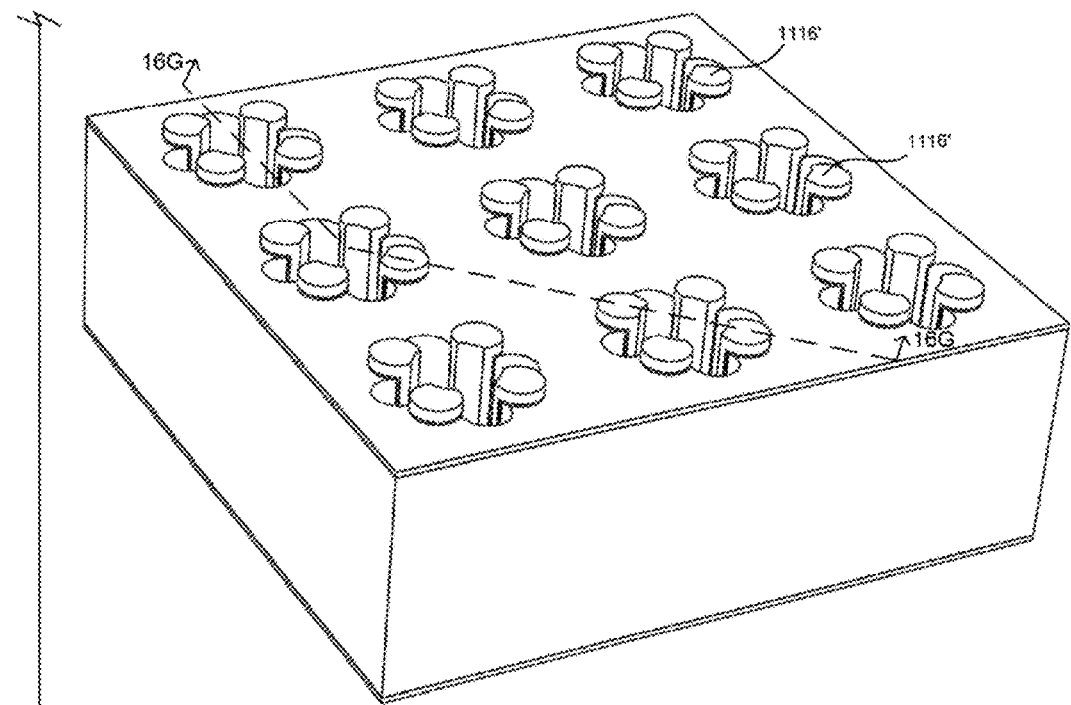
Figure 16G:
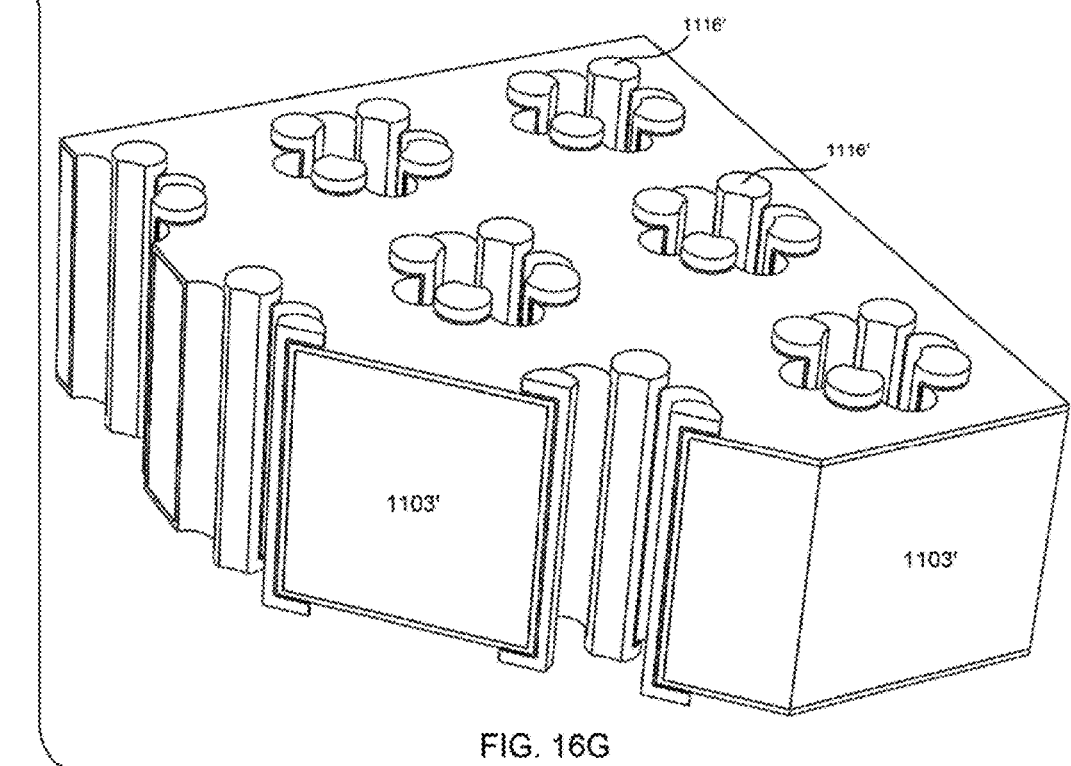

Referring now to FIGS. 16-16G, a method of making the interconnection component 1100 in accordance with an alternative embodiment is shown. Referring first to FIG. 16 and FIG. 16A (a cross-sectional view taken along line 16A-15A of FIG. 16), a substrate base 1103' identical to the substrate base 1103 of FIG. 15, a dielectric layer 1132' is again provided over the exposed surfaces 1107',1109' of the substrate base 1103', as well as within the openings 1110'. In contrast to the previous embodiment, after providing a dielectric layer 1032, a resist layer 1184' is then provided on the exposed surfaces 1135' of dielectric layer 1132' second within openings 1110' As shown, the dielectric layer 1132' within openings 1110' is exposed through the openings 1110' in the resist layer 1184'.

Turning to FIG. 16B and FIG. 16C (a cross-sectional view taken along line 16C-16C of FIG. 16B), using the openings 1186' as a mask, a seed/barrier material 1187' may then be provided on the first and second surfaces 1106',1108' of the dielectric layer 1132 and within the openings 1110'. Turning to FIG. 16D- and FIG. 16E (a cross-sectional view taken along line 16E-16E of FIG. 16D), a metal may be provided over the exposed portion of the seed/barrier layer 1187' to create conductors 1116'. Turning to FIG. 16F and FIG. 16G (a cross-sectional view taken along line 16G-16G of FIG. 16F), resist material that fills the openings 1110' in the substrates may be removed, such as by selective etching. This provides for openings that are similar to the openings shown in FIG. 15M, but created by a different process. The resist layer 1184' may then be removed to reveal the interconnection element 1100 of FIG. 13. Preparing the interconnection component in this manner eliminates the step of having to remove the seed layer, and only requires removal of the resist layer.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An interconnection component, comprising:
   an element having first and second opposed surfaces defining a thickness of less than 1000 microns, the element having an opening extending between the first and second surfaces, the opening having at least one inner edge surface, the element consisting essentially of a material having a coefficient of thermal expansion of less than 10 parts per million per degree Celsius;
   a dielectric layer other than the material, the dielectric layer having a top surface, a bottom surface, and an edge surface extending between the top and bottom surfaces, the edge surface of the dielectric layer being at least partially aligned with the at least one inner edge surface of the opening,
   a plurality of conductors electrically insulated from one another extending through the opening, at least some of the conductors extending along the at least one inner edge surface of the opening and overlying the edge surface of the first dielectric layer, the conductors defining a plurality of wettable first contacts at the first surface, the first contacts being at least partially aligned with the opening in a direction of the thickness and electrically insulated from one another; and
   a plurality of second contacts exposed at the second surface and electrically insulated from one another.

2. The interconnection component as claimed in claim 1, further comprising masses of bond material attached to the first contacts.

3. The interconnection component as claimed in claim 1, wherein the masses of bond material include a bond metal.

4. The interconnection component as claimed in claim 1, wherein at least some of the first contacts partially overlie the first surface.

5. The interconnection component as claimed in claim 4, further comprising masses of bond metal attached to the second contacts.

6. The interconnection component as claimed in claim 1, wherein the second contacts are aligned at least partially with the opening in a direction of the thickness, the second contacts being defined by the plurality of conductors.

7. The interconnection component as claimed in claim 5, wherein at least some of the second contacts partially overlie the second surface.

8. The interconnection component as claimed in claim 1, wherein portions of the conductors defining the first contacts include a first metal layer and a first wettable layer, the first wettable layer including at least one of organic solderability preservative, a metal or a conductive compound of a metal.

9. The interconnection component as claimed in claim 8, wherein the first wettable layer is a metal clad layer.

10. The interconnection component as claimed in claim 8, wherein the conductors have surfaces extending into the opening which are uncovered by the first wettable layer.

11. The interconnection component as claimed in claim 8, wherein the second contacts are aligned at least partially with the opening in a direction of the thickness, the second contacts being defined by the plurality of conductors, the second contacts including a second metal layer and a second wettable layer, the second wettable layer including at least one of organic solderability preservative, a metal or a conductive compound of a metal.

12. The interconnection component as claimed in claim 11, wherein the conductors have surfaces extending into the opening which are uncovered by the wettable layer.

13. The interconnection component as claimed in claim 1, further comprising a void within the opening.

14. The interconnection component as claimed in claim 13, wherein the void is open to the plurality of conductors.

15. The interconnection component as claimed in claim 1, further comprising a dielectric region disposed within the opening, the plurality of conductors being insulated from one another by the dielectric region, wherein the dielectric region has a dielectric constant K of less than 2.0.

16. The interconnection component as claimed in claim 1, wherein the plurality of conductors define first and second pairs of coaxial conductors extending at least partially within the opening.

17. The interconnection component as claimed in claim 1, further comprising a dielectric region insulating the plurality of conductors from one another within the opening, the dielectric region having voids.

18. The interconnection component as claimed claim 1, wherein at least some of the first contacts are posts projecting to a height of at least 30 microns above the first surface.

19. The interconnection component as claimed in claim 1, wherein the opening includes a central opening and a plurality of peripheral openings each being open to the central opening, each of the central and peripheral openings extending through the thickness, wherein at least some of the conductors extend along inner surfaces of the peripheral openings.

20. The interconnection component of claim 1, wherein the at least some of the conductors overlie at least a portion of the first surface of the dielectric layer.

21. The interconnection component of claim 1, wherein the conductors are electrically insulated from one another.

22. An interconnection component, comprising:
   an element having first and second opposed surfaces defining a thickness of less than 500 microns, the element having an opening extending between the first and second surfaces, the element consisting essentially of a first material having a coefficient of thermal expansion of less than 10 parts per million per degree Celsius;

a dielectric layer other than the first material disposed within the opening;

a plurality of conductors extending through the dielectric layer within the opening, the conductors defining a plurality of wettable first contacts at the first surface, the first contacts being aligned at least partially with the opening in a direction of the thickness, at least first and second ones of the conductors being configured to simultaneously carry first and second different electric potentials;

masses of bond material attached to the first contacts; and a plurality of second contacts exposed at the second surface and electrically insulated from one another.

23. The interconnection component as claimed in claim 22, wherein the dielectric layer has a Young's modulus lower than a Young's modulus of the plurality of conductors and lower than a Young's modulus of the element.

24. The interconnection component as claimed in claim 22, wherein the plurality of conductors define first and second pairs of coaxial conductors extending at least partially within the opening.

25. The interconnection component as claimed in claim 24, wherein the plurality of conductors further includes at least one non-coaxial conductor extending at least partially within the opening.

26. The interconnection component as claimed in claim 25, further comprising a dielectric region insulating the plurality of conductors from one another within the opening, the dielectric region having voids.

27. The interconnection component as claimed in claim 22, wherein at least some of the first contacts are posts projecting to a height of at least 30 microns above the first surface.

28. The interconnection component as claimed in claim 27, further comprising second contacts at least partially aligned with the opening in a direction of the thickness, the second contacts being defined by the plurality of conductors, wherein at least some of the second contacts are posts projecting to a height of at least 30 microns above the second surface.

29. A microelectronic assembly including the interconnection component as claimed in claim 28, further comprising a microelectronic element having contacts on a contact-bearing face thereof facing the first surface, the contacts being joined to corresponding ones of the first contacts through masses of bond material.

30. The microelectronic assembly of claim 29 further comprising first and second microelectronic elements, each having contacts on a contact-bearing face thereof facing the first surface, the contacts of each of the first and second microelectronic elements being joined to corresponding ones of the first contacts through masses of bond material.

31. The microelectronic assembly as claimed in claim 30, wherein said first and second microelectronic elements may be active chips or passive components.

32. The microelectronic assembly as claimed in claim 30, wherein said first and second microelectronic elements are joined through the interconnection component to third and fourth components.

33. The interconnection component as claimed in claim 22, wherein the opening includes a central opening and a plurality of peripheral openings each being open to the central opening, each of the central and peripheral openings extending through the thickness, wherein at least some of the conductors extend along inner surfaces of the peripheral openings.

34. The interconnection component as claimed in claim 33, wherein each of the at least some conductors extends within a different one of the peripheral openings.

35. The interconnection component of claim 22, wherein the at least some of the plurality of conductors overlie at least a portion of the first surface of the dielectric layer.

36. The interconnection component of claim 22, wherein the opening has at least one inner edge surface, the dielectric layer is a second dielectric layer, the interconnection component including a third dielectric layer overlying the first surface of the element, the dielectric layer having a top surface, a bottom surface, and an edge surface extending between the top and bottom surfaces, the edge surface of the dielectric layer being aligned with the at least one inner edge surface of the opening, and at least some of the conductors overlie the edge surface of the first dielectric layer and at least a portion of the inner edge surface of the opening.

* * * * *